(12) United States Patent
Wu

(10) Patent No.: US 11,996,424 B2
(45) Date of Patent: May 28, 2024

(54) CONTROLLABLE GAP HEIGHT FOR AN IMAGE SENSOR PACKAGE

(71) Applicant: SEMICONDUCTOR COMPONENTS INDUSTRIES, LLC, Phoenix, AZ (US)

(72) Inventor: Weng-Jin Wu, Hsinchu (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/656,498

(22) Filed: Mar. 25, 2022

(65) Prior Publication Data

US 2022/0216256 A1 Jul. 7, 2022

Related U.S. Application Data

(62) Division of application No. 16/506,442, filed on Jul. 9, 2019, now Pat. No. 11,289,522.

(60) Provisional application No. 62/828,764, filed on Apr. 3, 2019.

(51) Int. Cl.
H01L 27/146 (2006.01)

(52) U.S. Cl.
CPC .. *H01L 27/14618* (2013.01); *H01L 27/14634* (2013.01); *H01L 27/14636* (2013.01); *H01L 27/14643* (2013.01); *H01L 27/14683* (2013.01); *H01L 27/1469* (2013.01); *H01L 27/14625* (2013.01)

(58) Field of Classification Search
CPC ......... H01L 27/14618; H01L 27/14634; H01L 27/14636; H01L 27/14643; H01L 27/14683; H01L 27/1469; H01L 27/14625
See application file for complete search history.

(56) References Cited

U.S. PATENT DOCUMENTS

| 8,432,011 | B1 | 4/2013 | Oganesian |
| 8,796,800 | B2 | 8/2014 | Oganesian |
| 9,136,293 | B2 | 9/2015 | Yee et al. |
| 2004/0164981 | A1* | 8/2004 | Fujita ................ H01L 27/14618 257/E31.118 |
| 2005/0057883 | A1 | 3/2005 | Bolken et al. |
| 2008/0191297 | A1 | 8/2008 | Yang et al. |
| 2009/0045476 | A1* | 2/2009 | Peng ................ H01L 27/14683 257/E31.127 |
| 2009/0068798 | A1 | 3/2009 | Oliver et al. |

(Continued)

FOREIGN PATENT DOCUMENTS

WO 2017177631 A1 10/2017

*Primary Examiner* — Ahmed N Sefer
(74) *Attorney, Agent, or Firm* — Brake Hughes Bellermann LLP

(57) ABSTRACT

According to an aspect, an image sensor package includes a transparent member, a substrate, and an interposer disposed between and coupled to the transparent member and the substrate, where the interposer defines a first cavity area and a second cavity area. The image sensor package includes an image sensor die disposed within the first cavity area of the interposer, where the image sensor die has a sensor array configured to receive light through the transparent member and the second cavity area. The image sensor package includes a bonding material that couples the image sensor die to the interposer within the first cavity area.

16 Claims, 15 Drawing Sheets

(56) References Cited

U.S. PATENT DOCUMENTS

| | | | |
|---|---|---|---|
| 2009/0180013 A1* | 7/2009 | Kinoshita | H01L 27/14618 |
| | | | 348/308 |
| 2009/0267170 A1 | 10/2009 | Chien et al. | |
| 2009/0309202 A1 | 12/2009 | Hsu et al. | |
| 2012/0276951 A1 | 11/2012 | Webster et al. | |
| 2013/0221470 A1 | 8/2013 | Kinsman et al. | |
| 2013/0264703 A1 | 10/2013 | Tae et al. | |
| 2014/0070349 A1 | 3/2014 | Oganesian | |
| 2016/0005778 A1* | 1/2016 | Jun | H01L 27/14618 |
| | | | 257/434 |
| 2016/0190204 A1* | 6/2016 | Chiu | H01L 24/97 |
| | | | 438/64 |
| 2016/0260761 A1* | 9/2016 | Jun | H01L 27/14636 |
| 2016/0284751 A1* | 9/2016 | Ho | H01L 24/05 |
| 2017/0008760 A1 | 1/2017 | Lloyd et al. | |
| 2017/0012142 A1 | 1/2017 | Lin et al. | |
| 2017/0200755 A1 | 7/2017 | Teng et al. | |
| 2019/0206916 A1* | 7/2019 | Lin | H01L 24/09 |
| 2019/0326339 A1* | 10/2019 | Dong | H01L 31/0203 |
| 2020/0135790 A1* | 4/2020 | Kim | H04N 25/75 |

* cited by examiner

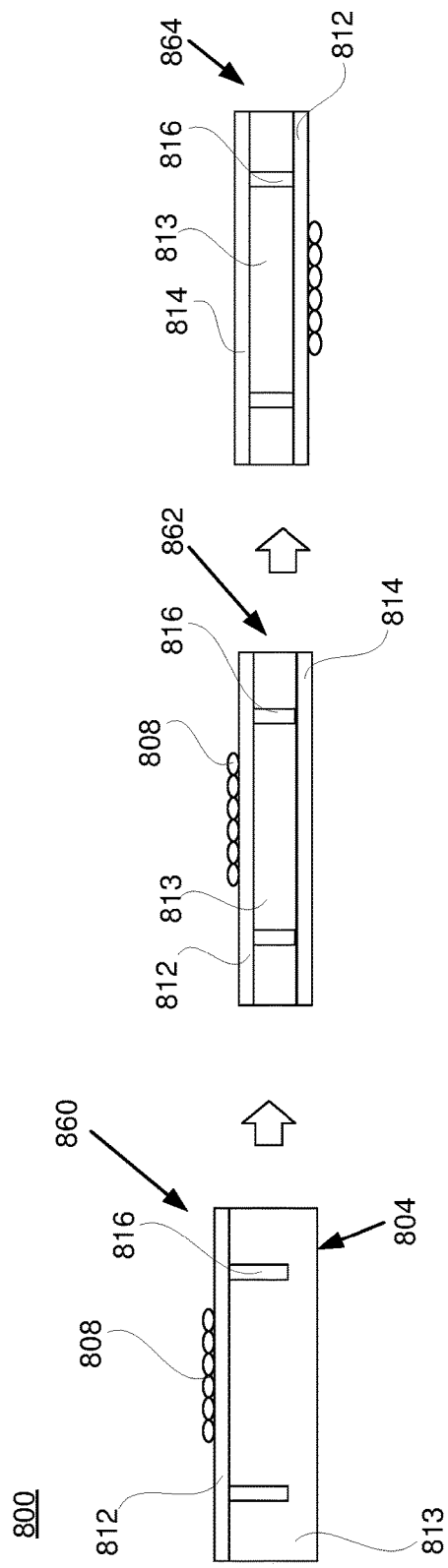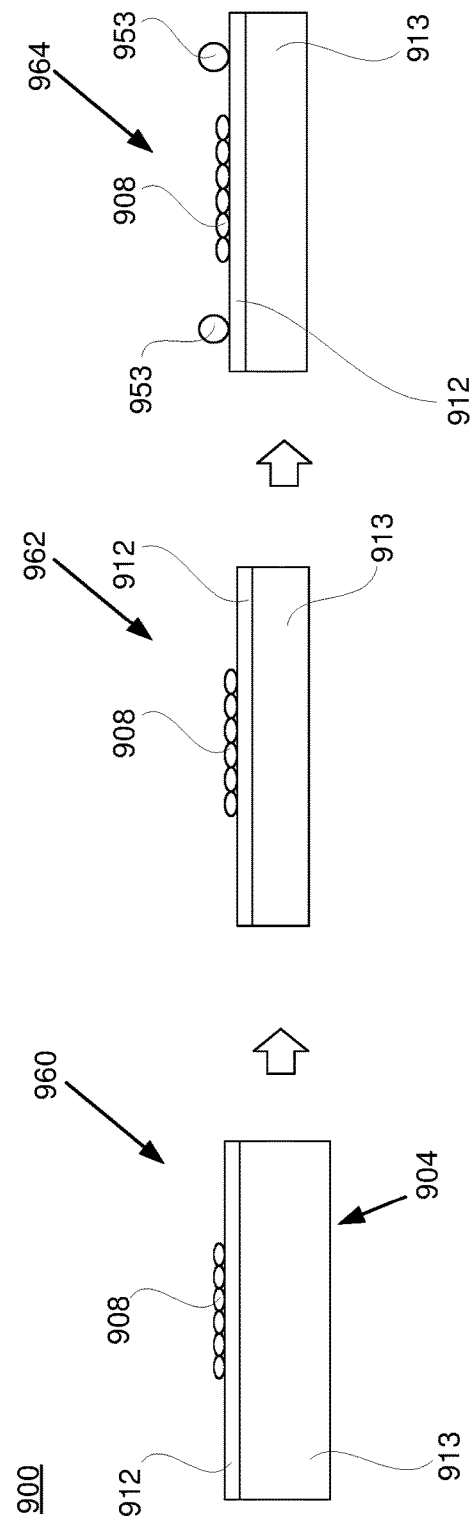
FIG. 8
FIG. 9

CONTROLLABLE GAP HEIGHT FOR AN IMAGE SENSOR PACKAGE

CROSS-REFERENCE TO RELATED APPLICATIONS

This application claims the benefit of U.S. Provisional Patent Application No. 62/828,764, filed on Apr. 3, 2019, and U.S. Non-provisional patent application Ser. No. 16/506,442, filed Jul. 9, 2019, the entire contents of each is incorporated herein by reference.

TECHNICAL FIELD

This description relates to an image sensor package having a controllable gap height.

BACKGROUND

Image sensor packages are commonly used in camera modules in a wide variety of applications. An image sensor package may include a cover glass that is coupled to a sensor device in a manner that a gap exists between an active area of the sensor device and an interior surface of the cover glass. In some examples, a bonding material is used to couple the sensor device to the cover glass, and a size of the bonding material may define the gap height.

SUMMARY

According to an aspect, an image sensor package includes a transparent member, a substrate, and an interposer disposed between and coupled to the transparent member and the substrate, where the interposer defines a first cavity area and a second cavity area. The image sensor package includes an image sensor die disposed within the first cavity area of the interposer, where the image sensor die has a sensor array configured to receive light through the transparent member and the second cavity area. The image sensor package includes a bonding material that couples the image sensor die to the interposer within the first cavity area.

According to some aspects, the image sensor package includes one or more of the following features (or any combination thereof). The second cavity area may define at least a portion of an empty space between the transparent member and the sensor array. The substrate may be a redistribution layer. The transparent member may be coupled to the interposer using a secondary bonding material. The image sensor die may include a complementary metal-oxide semiconductor (CMOS) image sensor. The image sensor die may be electrically connected to the substrate. The image sensor die may define one or more conductive vias. The image sensor package may include a conductive trace coupled to the interposer within the first cavity area, where the conductive trace extends to the substrate, and a conductive component coupled to the conductive trace and the image sensor die. The image sensor package may include a plurality of conductive components coupled to the substrate. The image sensor package may include a device coupled to the substrate, a secondary substrate, and a molding that extends between the substrate and the secondary substrate. The device may be coupled to the substrate in a flip-chip configuration.

According to an aspect, an image sensor package includes a transparent member, a substrate, and an interposer disposed between and coupled to the transparent member and the substrate, where the interposer defines a cavity area. The image sensor package includes an image sensor die disposed within the cavity area of the interposer, where a distance between a sensor array of the image sensor die and the transparent member defines a gap height, where the gap height is based on a size of the interposer, and a bonding material that couples the image sensor die to the interposer within the cavity area. The image sensor die may include an interconnection layer, a sensor substrate layer, and a redistribution layer, where the sensor substrate layer defines one or more conductive vias. The image sensor package includes a conductive trace coupled to the interposer within the first cavity area, where the conductive trace extends to the substrate, and a conductive component coupled to the conductive trace and the image sensor die. The substrate includes a first surface and a second surface, where the first surface of the substrate is coupled to the image sensor die, and the image sensor package may include a device coupled to the second surface of the substrate. The substrate is a first substrate, and the image sensor package includes a second substrate, and a molding disposed between the first substrate and the second substrate, where the molding encapsulates the device. The image sensor package may include one or more conductive vias extending through the molding. The interposer may be coupled to the transparent member with a secondary bonding material.

According to an aspect, a method for assembling an image sensor package includes forming an interposer with a cavity area, coupling a transparent member to the interposer using a first bonding material, disposing an image sensor die within the cavity area, and applying a second bonding material to a gap between an edge of the image sensor die and a portion of the interposer defined by the cavity area, where a height of the interposer at least partially defines a distance between the transparent member and a sensory array of the image sensor. In some examples, the method includes applying a metal trace portion the portion of the interposer defined by the cavity area.

The details of one or more implementations are set forth in the accompanying drawings and the description below. Other features will be apparent from the description and drawings, and from the claims.

BRIEF DESCRIPTION OF THE DRAWINGS

FIGS. 8 through 14 illustrate example operations for fabricating image sensor packages according to various aspects.

DETAILED DESCRIPTION

The present disclosure relates to an image sensor package having an interposer that provides a relatively rigid structure for an image sensor die. For example, the interposer defines a cavity area (e.g., a cut-out portion of the interposer) that receives the image sensor die. The image sensor die is coupled to the interposer within the cavity area of the interposer, and a transparent member (e.g., a glass cover) is coupled to the interposer via a bonding material. The size (e.g., thickness) of the interposer (as well as the size of the cavity area) may control a gap height between an active area of the image sensor die and the transparent member.

In some examples, the image sensor package discussed herein may increase (or control) the gap height (without using additional bonding material to support a higher gap height), thereby permitting relatively larger image sensor devices to be used in compact image sensor packages. For instance, without the use of the interposer, an image sensor package may have to use a relatively large amount of bonding material to couple the transparent member to the image sensor die, where the bonding material acts as a dam member that spaces the transparent member away from the active area of the sensor, in order to increase the size of the gap height. The increased amount of the bonding material (in order to increase the gap height) may cause delamination or be susceptible to cracks.

However, the image sensor package discussed herein may control the gap height with the interposer in a manner that does not require additional bonding material, thereby decreasing the risk of delamination or cracks. In addition, in some examples, the interposer may reduce (or block) lateral incident light into the sensor array of the image sensor package, which can improve the quality of the captured image. Furthermore, relatively large image sensor devices may have limited space to use bond wires (e.g., a small amount of space may exist from a sensor edge to a sensor array edge).

Figure 1A:
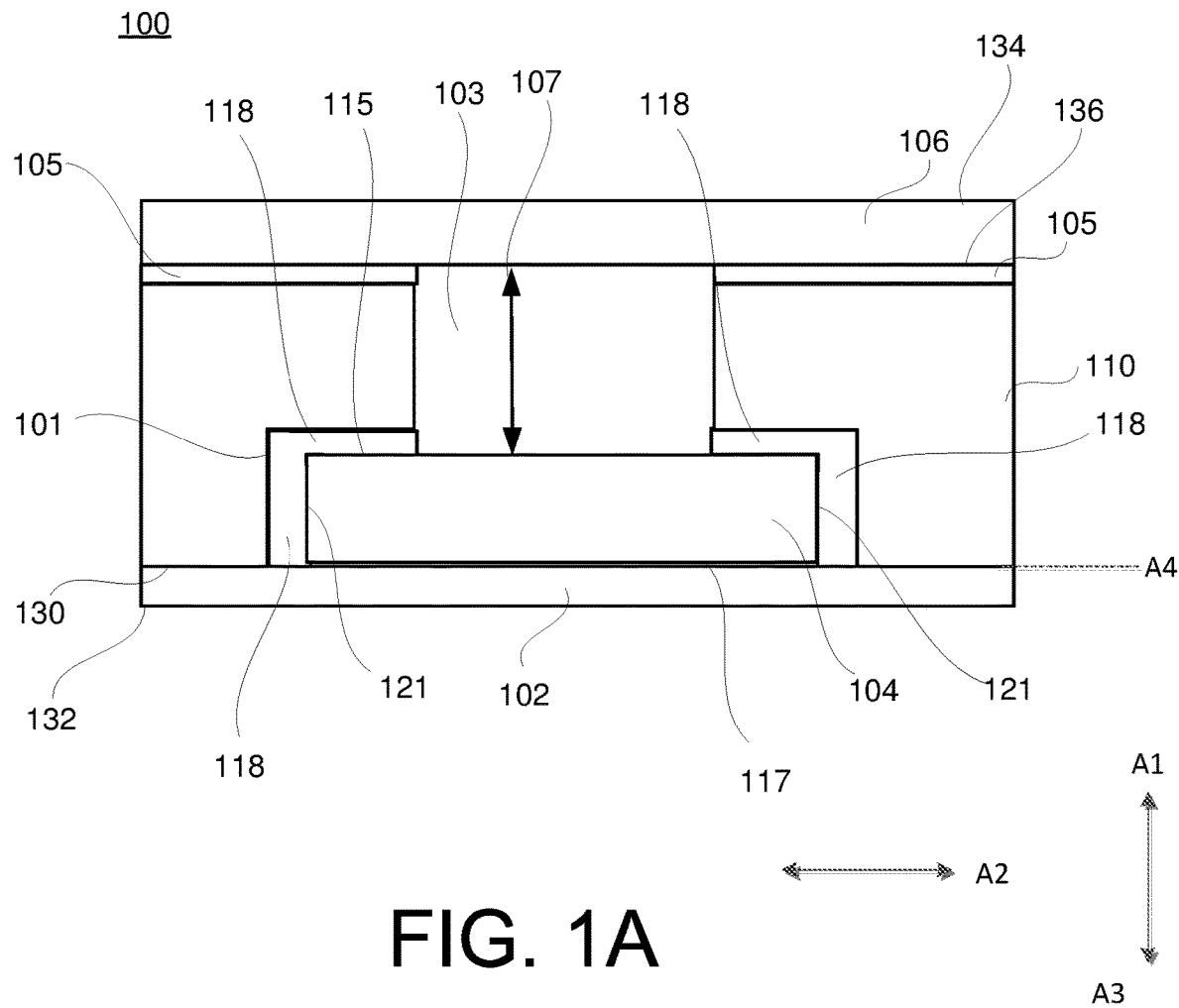
FIGS. 1A-1B illustrate an image sensor package according to an aspect.
Figure 1B:
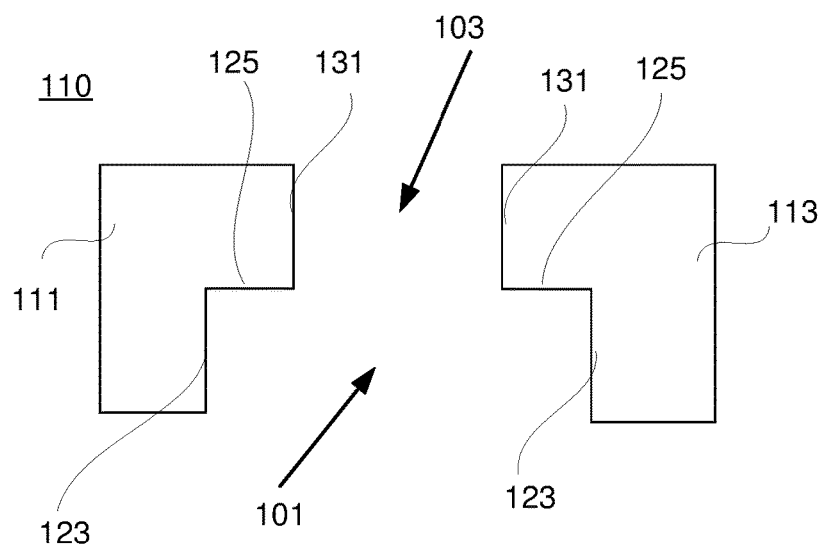

FIG. 1A illustrates an image sensor package 100 according to an aspect, and FIG. 1B illustrates an interposer 110 used within the image sensor package 100 according to an aspect. In some examples, the image sensor package 100 includes a complementary metal-oxide-semiconductor (CMOS) image sensor (CIS) package.

The image sensor package 100 includes a substrate 102, an image sensor die 104, the interposer 110, and a transparent member 106. The transparent member 106 is coupled to the interposer 110 via a bonding material 105. In some examples, the image sensor die 104 includes a CMOS image sensor die.

The interposer 110 is disposed between and coupled to the transparent member 106 and the substrate 102. The interposer 110 defines a first cavity area 101 that defines the space to hold the image sensor die 104. In some examples, the first cavity area 101 is a cutout (or removed) portion of the interposer 110. In some examples, the interposer 110 defines a first portion 111 and a second portion 113, where the second portion 113 is a separate body from the first portion 111. Each of the first portion 111 and the second portion 113 includes a first inner edge 123 and a second inner edge 125. The first inner edge 123 and the second inner edge 125 of the first portion 111 and the second portion 113 may define the first cavity area 101. In some examples, the second inner edge 125 is disposed at an angle (e.g., perpendicular) to the first inner edge 123. In some examples, a length of the first inner edge 123 in a direction A1 is greater than a height of the image sensor die 104 in the direction A1. In some examples, a distance along a direction A2 between the first inner edge 123 of the first portion 111 and the first inner edge 123 of the second portion 113 is greater than a width of the image sensor die 104 in the direction A2.

The image sensor die 104 is disposed within the first cavity area 101 and coupled to the interposer 110 using a bonding material 118. The bonding material 118 includes portions disposed in a gap defined by the space between a sensor edge 121 of the image sensor die 104 and the first inner edge 123 of the interposer 110. In some examples, the bonding material 118 includes portions disposed in a gap defined by the space between a first surface 115 of the image sensor die 104 and the second inner edge 125. In some examples, the bonding material 118 includes an adhesive material. In some examples, the bonding material 118 includes glue bonding material, fusion bonding material, and/or anodic bonding material. In some examples, the bonding material 118 includes epoxy resin.

The interposer 110 includes a second cavity area 103 that defines (at least in part) an empty space between the image sensor die 104 and the transparent member 106. The second cavity area 103 may be a cutout (or removed) portion from the interposer 110. In some examples, the second cavity area 103 is devoid of any package element (e.g., is empty space). Each of the first portion 111 and the second portion 113 may define an inner edge 131. The second cavity area 103 may be defined by the space between the inner edge 131 of the first portion 111 and the inner edge 131 of the second portion 113. In some examples, the distance between the inner edge 131 of the first portion 111 and the inner edge 131 of the second portion 113 in the direction A2 is less than the width of the image sensor die 104 in the direction A2. The image sensor die 104 is associated with or includes a sensor array (disposed on the first surface 115 of the image sensor die 104) that is configured to receive light through the transparent member 106 and the second cavity area 103. The sensor array may include an array of pixel elements configured to convert electromagnetic radiation (e.g., light) to electrical signals.

In some examples, the interposer 110 includes a substrate (e.g., an insulating substrate). In some examples, the interposer 110 is a silicon interposer. In some examples, the interposer 110 includes a base material, where the base material is a dielectric material or an insulating material). In some examples, the interposer 110 includes one or more electrical traces coupled to one or more surfaces (or embedded within) the base material of the interposer 110.

The interposer 110 (and the bonding material 105) may position the transparent member 106 away from the image sensor die 104 in the direction A1. The transparent member 106 includes a first surface 134 and a second surface 136 disposed opposite to the first surface 134. The distance between the second surface 136 of the transparent member 106 and the image sensor die 104 defines a gap height 107, and the gap height 107 is based on the thickness of the interposer 110 (and the thickness of the bonding material 105) in the direction A1. In some examples, the gap height 107 may be increased through the use of the interposer 110 (thereby can support relatively larger sensor devices) such that the amount of the bonding material 105 is relatively small (thereby avoiding delamination or cracks that otherwise may occur if a larger amount of bonding material 105 is used).

The substrate 102 includes a first surface 130 and a second surface 132 disposed opposite to the first surface 130. In some examples, the substrate 102 is a redistribution layer. The redistribution layer may include one or more electrical traces and/or one or more passivation layers. In some examples, the electrical traces may be configured to and/or used to transmit signals to and/or from devices (e.g., electronic devices included in a semiconductor region (e.g., epitaxial layer and/or semiconductor substrate)) connected to the electrical traces. In some examples, the electrical traces can include conductive traces (e.g., metallic traces) such as copper traces, aluminum traces, and/or so forth. In some examples, the substrate 102 includes a printed circuit board (PCB) substrate. In some examples, the substrate 102 includes a dielectric material.

The first surface 130 of the substrate 102 is disposed in a plane A4. In some examples, the second surface 132 is disposed in parallel with the first surface 130. The direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The image sensor die 104 is coupled to the substrate 102. For example, a second surface 117 of the image sensor die 104 may be coupled to the first surface 130 of the substrate 102. In some examples, the image sensor die 104 may be coupled to the first surface 130 of the substrate 102 using one or more bonding materials (e.g., an adhesive layer, die attach film, polymer-based material, an epoxy resin, etc.) in order to physically couple the image sensor die 104 to the substrate 102. In some examples, the image sensor die 104 is coupled to the substrate 102 is a flip-chip configuration using one or more conductive bump member and an underfill material. In some examples substrate 102 is a distribution layer and the image sensor die 104 is coupled to the substrate 102 by one or more deposition and lithography methods.

The transparent member 106 is coupled to the interposer 110 using the bonding material 105. In some examples, the bonding material 105 includes an adhesive material. In some examples, the bonding material 105 includes glue bonding material, fusion bonding material, and/or anodic bonding material. In some examples, the bonding material 105 includes epoxy resin. In some examples, the bonding material 105 includes polymer-based material. In some examples, the bonding material 105 includes one or more materials that are different than the material(s) used for the bonding material 118. In some examples, the material(s) of the bonding material 105 may be the same as the material(s) used for the bonding material 118.

The transparent member 106 includes an optically transparent material that allows electromagnetic radiation (e.g., light (e.g., visible light)) to pass through (e.g., pass through the entirety of the material). In some examples, the transparent member 106 includes an optically transparent material that allows the transmission of light waves without being scattered (or being scattered to a relatively small or negligible degree). In some examples, the transparent member 106 includes a cover. In some examples, the transparent member 106 includes a lid. In some examples, the transparent member 106 includes one or more organic materials and/or one or more inorganic materials. In some examples, the transparent member 106 includes a glass material. In some examples, the glass material is coated on one or both surfaces. In some examples, the transparent member 106 includes one or more layers of transparent material.

Figure 2:
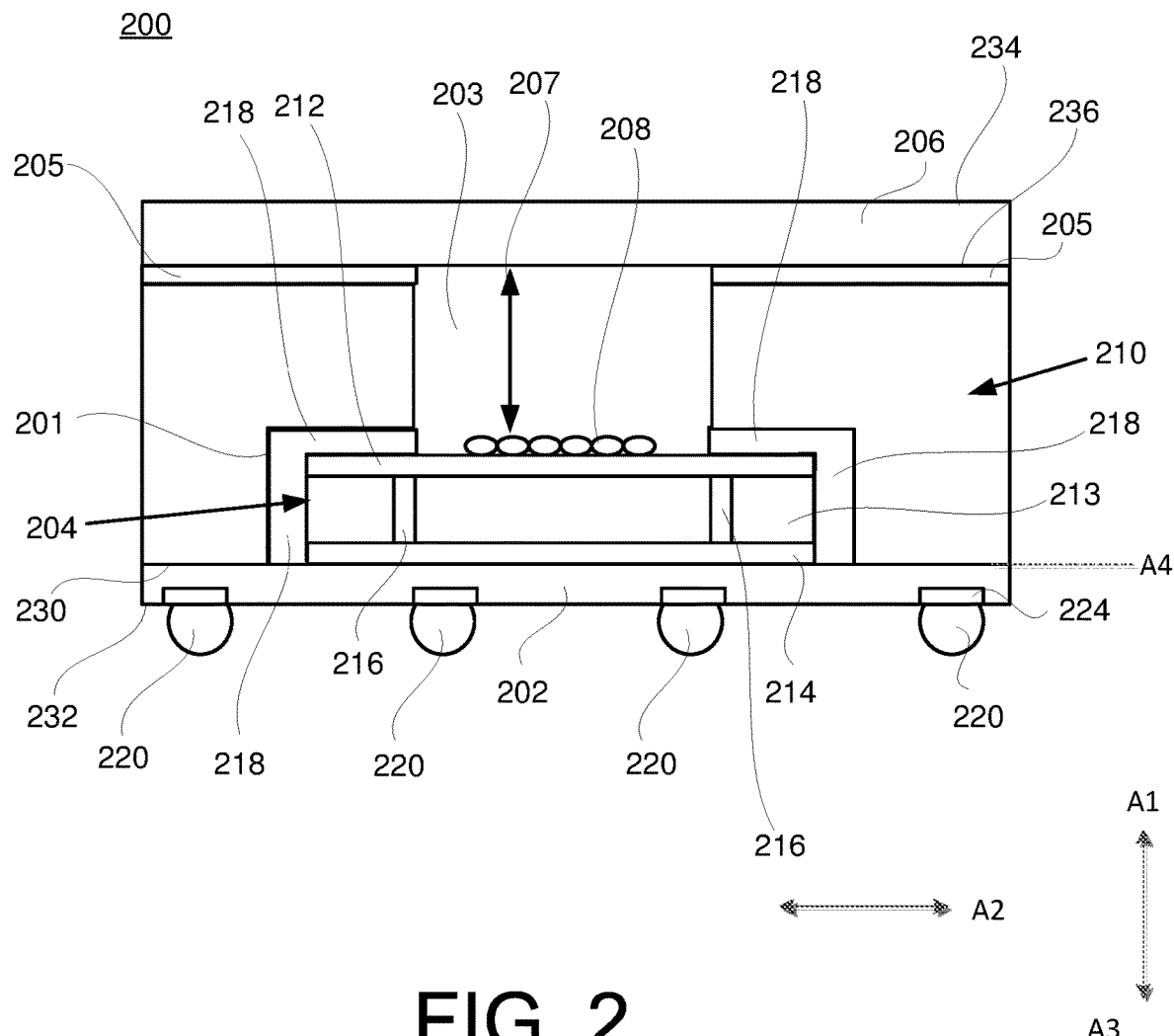
FIGS. 2 through 7 illustrate image sensor packages according to other aspects.

FIG. 2 illustrates an image sensor package 200 according to an aspect. The image sensor package 200 may include any of the features described with reference to the image sensor package 100 of FIGS. 1A and 1B. In some examples, the image sensor package 200 includes a complementary metal-oxide-semiconductor (CMOS) image sensor (CIS) package. The image sensor package 200 includes a substrate 202, an image sensor die 204 coupled to the substrate 202, an interposer 210, and a transparent member 206 coupled to the interposer 210 via a bonding material 205. The interposer 210 defines a first cavity area 201 that holds the image sensor die 204, and a second cavity area 203 that defines (at least in part) an empty space between the image sensor die 204 and the transparent member 206. The image sensor die 204 is disposed within the first cavity area 201, and coupled to the interposer 210 using a bonding material 218.

The substrate 202 includes a first surface 230 and a second surface 232 disposed opposite to the first surface 230. In some examples, the substrate 202 is a redistribution layer. The redistribution layer may include one or more electrical traces and/or one or more passivation layers. In some examples, the electrical traces may be configured to and/or used to transmit signals to and/or from devices (e.g., electronic devices included in a semiconductor region (e.g., epitaxial layer and/or semiconductor substrate)) connected to the electrical traces. In some examples, the electrical traces can include conductive traces (e.g., metallic traces) such as copper traces, aluminum traces, and/or so forth. In some examples, the substrate 202 includes a printed circuit board (PCB) substrate. In some examples, the substrate 202 includes a dielectric material. As shown in FIG. 2, the substrate 202 may include conductive contacts 224 that are exposed on the second surface 232 of the substrate 202. The conductive contacts 224 may include metallic elements such as conductive pads or terminals that are used to transfer electrical signals.

The image sensor package 200 includes conductive components 220 coupled to the conductive contacts 224 on the second surface 232 of the substrate 202. In some examples, the conductive components 220 are surface-mount packaging elements. In some examples, the conductive components 220 include solder balls. The conductive components 220 are components used to connect to an external device (e.g., a ball grid array (BGA) device). However, the conductive components 220 may include other types of surface-mount packaging elements.

The first surface 230 of the substrate 202 is disposed in a plane A4. In some examples, the second surface 232 is disposed in parallel with the first surface 230. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The image sensor die 204 may include a CMOS image sensor die. In some examples, the image sensor die 204 includes an interconnection layer 212, a sensor substrate layer 213, and a redistribution layer 214. In some examples, the image sensor die 204 includes one or more vias 216. In some examples, the vias 216 are holes that are plated or filled with one or more conductive (e.g., metal) materials. In some examples, the vias 216 extend through the sensor substrate layer 213 and electrically connect the interconnection layer 212 to the redistribution layer 214. The image sensor die 204 includes a sensor array 208. The sensor array 208 may include an array of pixel elements configured to convert electromagnetic radiation (e.g., light) to electrical signals. In some examples, the sensor array 208 is coupled to the interconnection layer 212. The area on the surface that includes the sensor array 208 may define the active area of the image sensor die 204.

The image sensor die 204 is disposed within the first cavity area 201 of the interposer 210, and the image sensor die 204 is coupled to the interposer 210 using the bonding material 218. The interposer 210 is also coupled to the first surface 230 of the substrate 202. In some examples, the interposer 210 includes a base material. In some examples, the base material includes a dielectric material. In some examples, the base material includes an insulating material.

In some examples, the interposer 210 includes one or more electrical traces coupled to one or more surfaces (or embedded within) the base material of the interposer 210.

The image sensor die 204 is coupled to the substrate 202. For example, the redistribution layer 214 of the image sensor die 204 may be coupled to first surface 230 of the substrate 202 using one or more bonding materials (e.g., an adhesive layer, die attach film, polymer-based material, an epoxy resin, etc.) in order to physically couple the image sensor die 204 to the substrate 202. In some examples, the substrate 202 is a redistribution layer and the image sensor die 204 is coupled to the substrate 202 by one or more deposition and lithography methods.

The transparent member 206 is coupled to the interposer 210 using the bonding material 205. In some examples, the bonding material 205 includes an adhesive material. In some examples, the bonding material 205 includes a glue bonding material, a fusion bonding material, and/or an anodic bonding material. In some examples, the bonding material 205 includes an epoxy resin. In some examples, the bonding material 205 includes a polymer-based material. In some examples, the bonding material 205 includes one or more materials that are different than the material(s) used for the bonding material 218. In some examples, the material(s) of the bonding material 205 may be the same as the material(s) used for the bonding material 218.

The interposer 210 and the bonding material 205 may position the transparent member 206 away from the sensor array 208 in the direction A1. The transparent member 206 includes a first surface 234 and a second surface 236 disposed opposite to the first surface 234. The distance between the second surface 236 of the transparent member 206 and the sensor array 208 defines a gap height 207, and the gap height 207 is controlled by the thickness of the interposer 210 and the thickness of the bonding material 205 in the direction A1. In some examples, the thickness of the interposer 210 is at least twice the thickness of the bonding material 205. In some examples, the gap height 207 may be increased through the use of the interposer 210 (thereby can support relatively larger sensor devices) such that the amount of the bonding material 205 is relatively small (thereby avoiding delamination or cracks that otherwise may occur if a larger amount of bonding material 205 is used).

The transparent member 206 includes an optically transparent material that allows electromagnetic radiation (e.g., light (e.g., visible light)) to pass through (e.g., pass through the entirety of the material). In some examples, the transparent member 206 includes an optically transparent material that allows the transmission of light waves without being scattered (or being scattered to a relatively small or negligible degree). In some examples, the transparent member 206 includes a cover. In some examples, the transparent member 206 includes a lid. In some examples, the transparent member 206 includes one or more organic materials and/or one or more inorganic materials. In some examples, the transparent member 206 includes a glass material. In some examples, the glass material is coated on one or both surfaces. In some examples, the transparent member 206 includes one or more layers of transparent material.

Figure 3:
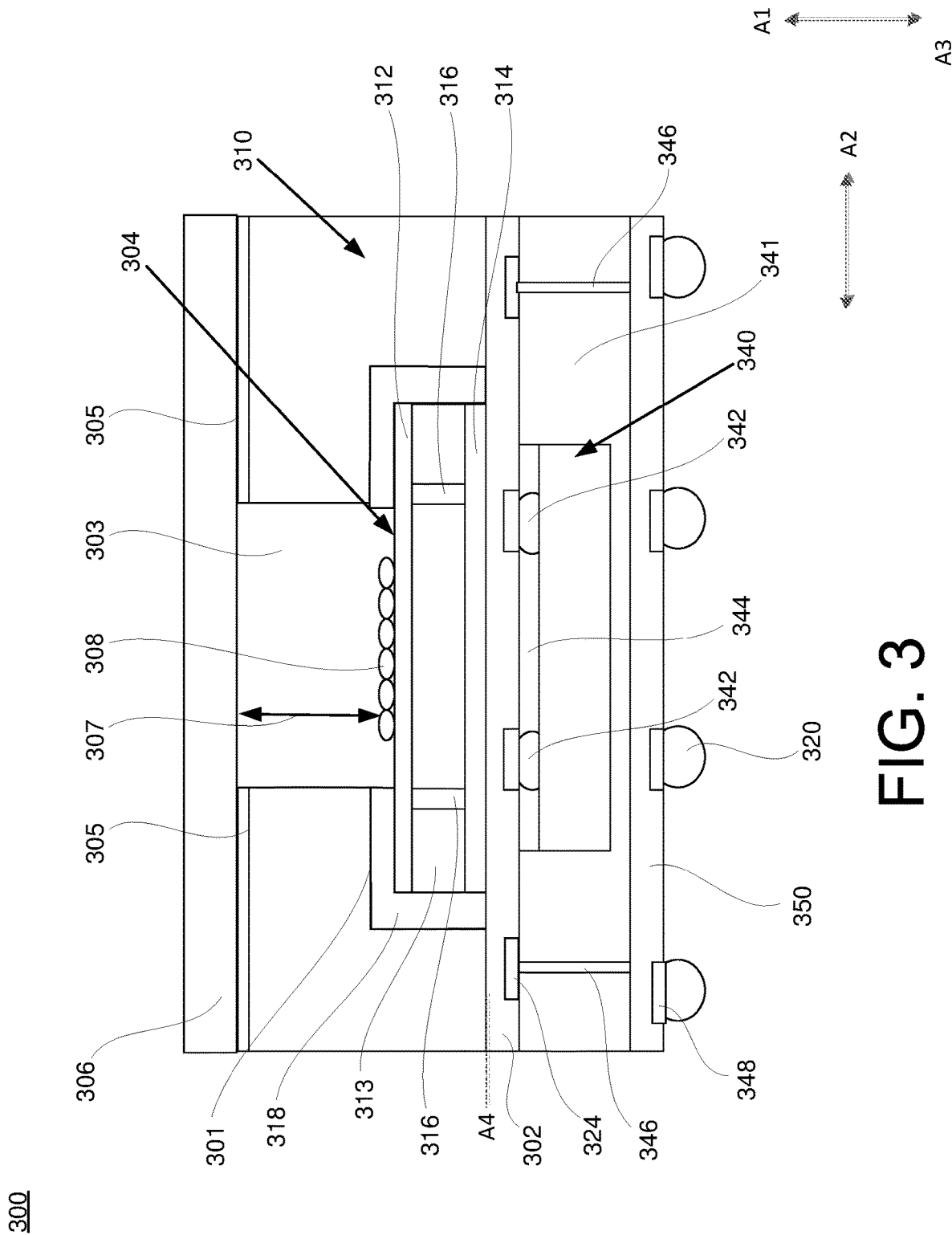

FIG. 3 illustrates an image sensor package 300 according to an aspect. The image sensor package 300 includes multiple semiconductor devices. In some examples, the image sensor package 300 includes a CMOS image sensor package with multiple semiconductor devices. The image sensor package 300 may include an image sensor die 304 and a device 340 arranged in a stacked configuration. In some examples, the image sensor package 300 includes two or more devices (e.g., different than the image sensor die 304). In some examples, the device 340 includes a semiconductor device. In some examples, the device 340 includes an integrated circuit (IC) driver die. In some examples, the device 340 includes a passive device.

In some examples, the image sensor package 300 is considered a two-level package, where the first level is the same (similar) to the image sensor package 200 of FIG. 2, and the second level is stacked on the first level and includes the device 340. The image sensor package 300 may include any of the features described with reference to the previous figures.

Similar to the image sensor package 200 of FIG. 2, the image sensor package 300 includes a substrate 302, an image sensor die 304 that is coupled to the substrate 302, an interposer 310, and a transparent member 306. The substrate 302 has a surface disposed with a plane A4. The interposer 310 may include one or more conductive contacts 324. The interposer 310 defines a first cavity area 301 and a second cavity area 303. The image sensor die 304 is disposed within the first cavity area 301, and the image sensor die 304 is coupled to the interposer 310 using a bonding material 318. The second cavity area 303 defines (at least in part) the empty space between a sensor array 308 of the image sensor die 304 and the transparent member 306.

The transparent member 306 is coupled to the interposer 310 using a bonding material 305. The interposer 310 and the bonding material 305 may position the transparent member 306 away from the sensor array 308 in the direction A1. The distance between the transparent member 306 and the sensor array 308 defines a gap height 307, and the gap height 307 is controlled by the thickness of the interposer 310 and the thickness of the bonding material 305 in the direction A1. For example, the gap height 307 may be increased through the use of the interposer 310 (thereby can support relatively larger sensor devices) such that the amount of the bonding material 305 is relatively small (thereby avoiding delamination or cracks that otherwise may occur if a larger amount of bonding material 305 is used).

The image sensor die 304 includes an interconnection layer 312, a sensor substrate layer 313, and a redistribution layer 314, and the image sensor die 304 includes one or more vias 316 that extend through the sensor substrate layer 313.

As shown in FIG. 3, the device 340 is coupled to the substrate 302. In some examples, the device 340 is coupled to the substrate 302 in a flip chip configuration. For example, the device 340 is coupled to the substrate 302 using one or more bump members 342 (e.g., copper pillars with solder, gold plated bumps, solder bumps, and/or gold stud bumps, etc.), and an under-fill material 344 is disposed in the gap between the device 340 and the substrate 302, where the under-fill material 344 encapsulates the bump members 342. In some examples, the substrate 302 is a redistribution layer and the image sensor die 304 is coupled to the substrate 302 by one or more deposition and lithography methods.

As shown in FIG. 3, the image sensor package 300 includes a substrate 350, and a molding 341 that extends between the substrate 350 and the substrate 302. The molding 341 may include an encapsulation material such as an epoxy molding. The molding 341 may include one or more types of material (e.g., in a molding compound if including multiple types of materials) such as a metal, a plastic, a resin, an epoxy, a phenolic hardener, a silica material, a pigment, a glass, a ceramic casing, and/or so forth. The molding 341 may encapsulate the device 340. In some examples, the substrate 350 includes a redistribution layer. The redistribution layer may include one or more electrical traces and one or more passivation layers. In some examples, the substrate 350 includes a PCB substrate having a dielectric material. The substrate 350 may include conductive contacts 324.

The image sensor package 300 includes one or more vias 346 that extend through the molding 341. For example, each via 346 may extend from a particular conductive contact 324 on the substrate 302 to a corresponding conductive contact 348 on the substrate 350. The image sensor package 300 includes conductive components 320 coupled to the conductive contacts 324 of the substrate 350. In some examples, the conductive components 320 are surface-mount packaging elements. In some examples, the conductive components 320 include solder balls. The conductive components 320 are components used to connect to an external device (e.g., a ball grid array (BGA) device). However, the conductive components 320 may include other types of surface-mount packaging elements.

Figure 4:
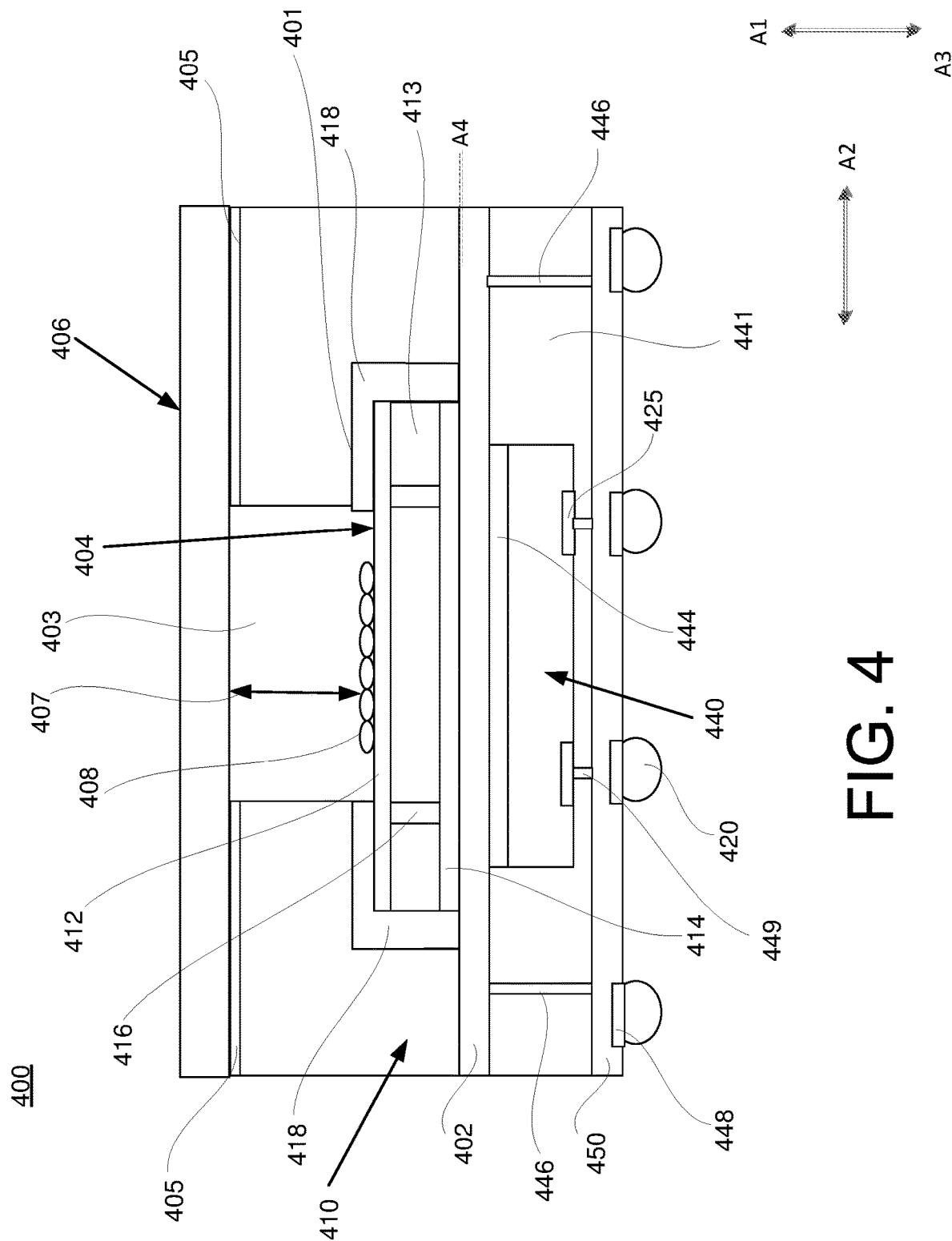

FIG. 4 illustrates an image sensor package 400 according to an aspect. The image sensor package 400 includes multiple semiconductor devices. In some examples, the image sensor package 400 includes a CMOS image sensor package with multiple semiconductor devices arranged in a two-level configuration. The image sensor package 400 may include an image sensor die 404 and a device 440 arranged in a stacked configuration. The image sensor package 400 may be similar to the image sensor package 300 of FIG. 3 except that the device 440 is coupled to a substrate 402 using a bonding material 444 in a non-flip-chip configuration. In some examples, the device 440 includes a passive device. In some examples, the device 440 includes a semiconductor device. In some examples, the device 440 includes a driver IC semiconductor device. The image sensor package 400 may include any of the features described with reference to the previous figures.

The image sensor package 400 includes a substrate 402, an image sensor die 404 that is coupled to the substrate 402, an interposer 410, and a transparent member 406. The substrate 402 has a surface disposed within the plane A4. The interposer 410 defines a first cavity area 401 and a second cavity area 403. The image sensor die 404 is disposed within the first cavity area 401, and the image sensor die 404 is coupled to the interposer 410 using a bonding material 418. The second cavity area 403 defines at least a portion of the empty space between a sensor array 408 of the image sensor die 404 and the transparent member 406. The transparent member 406 is coupled to the interposer 410 using a bonding material 405. The interposer 410 and the bonding material 405 may position the transparent member 406 away from the sensor array 408 in the direction A1. The distance between the transparent member 406 and the sensor array 408 defines a gap height 407, and the gap height 407 is controlled by the thickness of the interposer 410 and the thickness of the bonding material 405 in the direction A1.

The image sensor die 404 includes an interconnection layer 412, a sensor substrate layer 413, and a redistribution layer 414, and the image sensor die 404 includes one or more vias 416 that extend through the sensor substrate layer 413.

As shown in FIG. 4 the device 440 is coupled to the substrate 402 using the bonding material 444. As shown in FIG. 4, the image sensor package 400 includes a substrate 450, and a molding 441 that extends between the substrate 450 and the substrate 402. The molding 441 may encapsulate the device 440. In some examples, the substrate 450 includes a redistribution layer. The redistribution layer may include one or more electrical traces and one or more passivation layers. In some examples, the substrate 450 includes a PCB substrate having a dielectric material. The substrate 450 may include conductive contacts 448.

Referring to FIG. 4, the image sensor package 400 includes vias 449, where each via 449 extends from a conductive contact 425 on the device 440 to the substrate 450. In some examples, the image sensor package 400 includes one or more vias 446 that extend through the molding 441. For example, the vias 446 may extend from the substrate 402 to the substrate 450. The image sensor package 400 includes conductive components 420 coupled to the conductive contacts 448 of the substrate 450. In some examples, the conductive components 420 are surface-mount packaging elements. In some examples, the conductive components 420 include solder balls. The conductive components 420 are components used to connect to an external device (e.g., a ball grid array (BGA) device). However, the conductive components 420 may include other types of surface-mount packaging elements.

Figure 5:
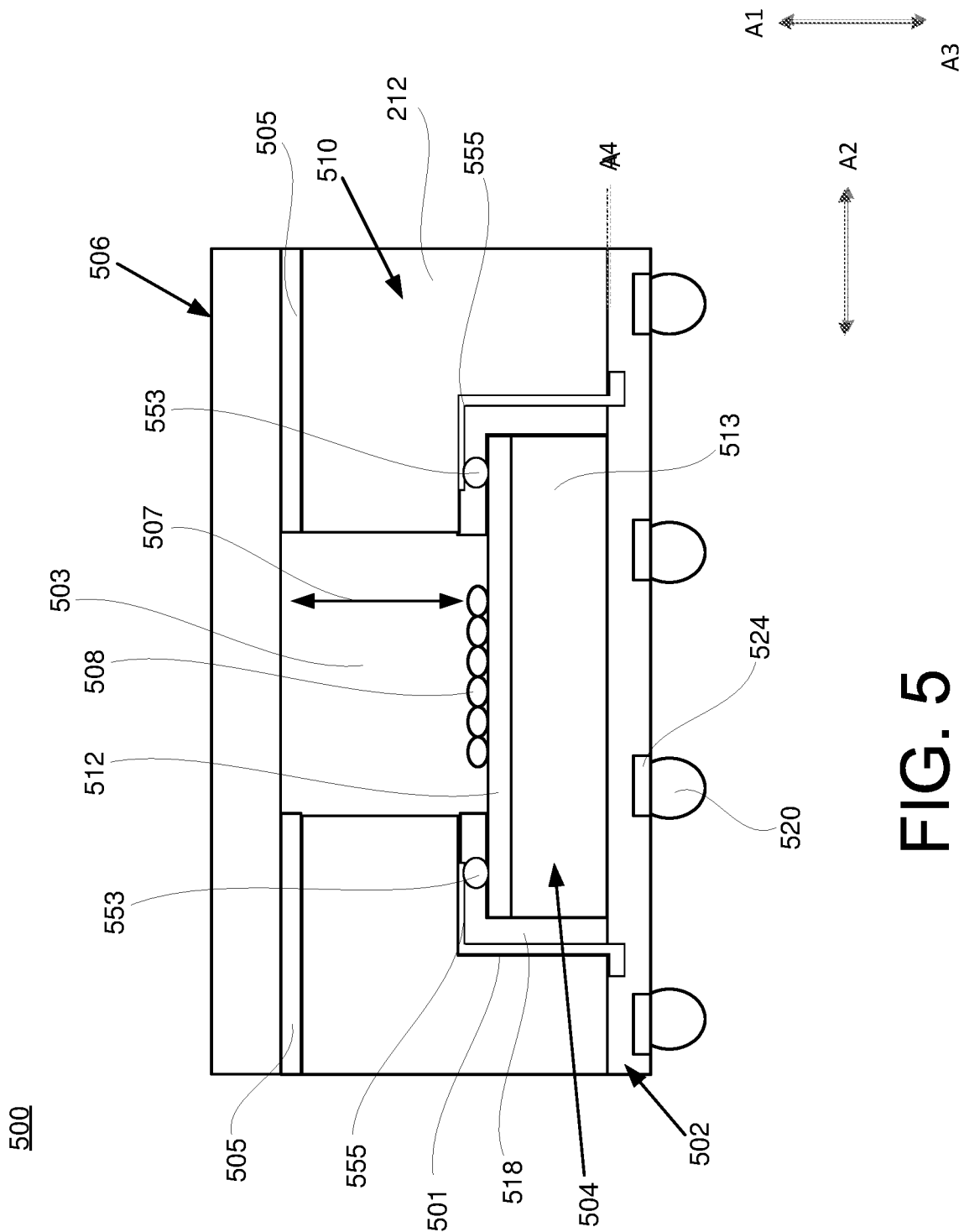

FIG. 5 illustrates an image sensor package 500 according to an aspect. In some examples, the image sensor package 500 includes a CIS package. The image sensor package 500 is similar to the image sensor package 200 of FIG. 2 except that an image sensor die 504 is electrically connected to a substrate 502 via conductive bumps 553 and metal trace portions 555, as further described below.

As shown in FIG. 5, the image sensor die 504 is coupled to the substrate 502. The substrate 502 has a surface disposed within the plane A4. The image sensor die 504 may include an image sensor semiconductor die. In some examples, the image sensor die 504 includes a CMOS image sensor die. In some examples, the image sensor die 504 includes an interconnection layer 512 and a sensor substrate layer 513. In some examples, the image sensor die 504 does not include a redistribution layer on the backside of the image sensor die 504. In some examples, the image sensor die 504 does not include a via through the sensor substrate layer 513. The image sensor die 504 includes a sensor array 508. The sensor array 508 may include an array of pixel elements configured to convert electromagnetic radiation (e.g., light) to electrical signals. In some examples, the sensor array 508 is coupled to the interconnection layer 512.

In some examples, the substrate 502 is a redistribution layer (e.g., a package redistribution layer). The redistribution layer may include one or more electrical traces and/or one or more passivation layers. In some examples, the electrical traces can include conductive traces (e.g., metallic traces) such as copper traces, aluminum traces, and/or so forth. In some examples, the substrate 502 includes a printed circuit board (PCB) substrate having a dielectric material. As shown in FIG. 5, the substrate 502 may include conductive contacts 524, and the conductive contacts 524 may include metallic elements such as conductive pads or terminals that are used to transfer electrical signals.

The image sensor package 500 may include conductive components 520 coupled to the conductive contacts 524. In some examples, the conductive components 520 are surface-mount packaging elements. In some examples, the conductive components 520 include solder balls. The conductive components 520 are components used to connect to an external device (e.g., a ball grid array (BGA) device). However, the conductive components 520 may include other types of surface-mount packaging elements.

The interposer 510 defines a first cavity area 501 that holds the image sensor die 504, and a second cavity area 503 that defines (at least in part) an empty space between the image sensor die 504 and the transparent member 506. The image sensor die 504 is disposed within the first cavity area 501, and coupled to the interposer 510 using a bonding material 518. The bonding material 518 is configured to hold the image sensor die 504 within the first cavity area 501. The interposer 510 is also coupled to the substrate 502. In some examples, the interposer 510 includes a base material. In some examples, the base material includes a dielectric material. In some examples, the base material includes an insulating material. In some examples, the interposer 510 includes one or more electrical traces coupled to one or more surfaces (or embedded within) the base material of the interposer 510.

The metal trace portions 555 are disposed on the interposer 510 within the first cavity area 501 and may extend to the substrate 502. A conductive bump 553 is disposed within the first cavity area 501 between a metal trace portion 555 and the interconnection layer 512 of the image sensor die 504. For example, the conductive bump 553 is coupled to the metal trace portion 555 and the interconnection layer 512.

A transparent member 506 is coupled to the interposer 510 using the bonding material 505. In some examples, the bonding material 505 includes an adhesive material. In some examples, the bonding material 505 includes glue bonding material, fusion bonding material, and/or anodic bonding material. In some examples, the bonding material 505 includes an epoxy resin. In some examples, the bonding material 505 includes a polymer-based material. The interposer 510 and the bonding material 505 may position the transparent member 506 away from the sensor array 508 in the direction A1. The distance between the transparent member 506 and the sensor array 508 defines a gap height 507, and the gap height 507 is controlled by the thickness of the interposer 510 and the thickness of the bonding material 505 in the direction A1. In some examples, the thickness of the interposer 510 is at least twice the thickness of the bonding material 505.

Figure 6:
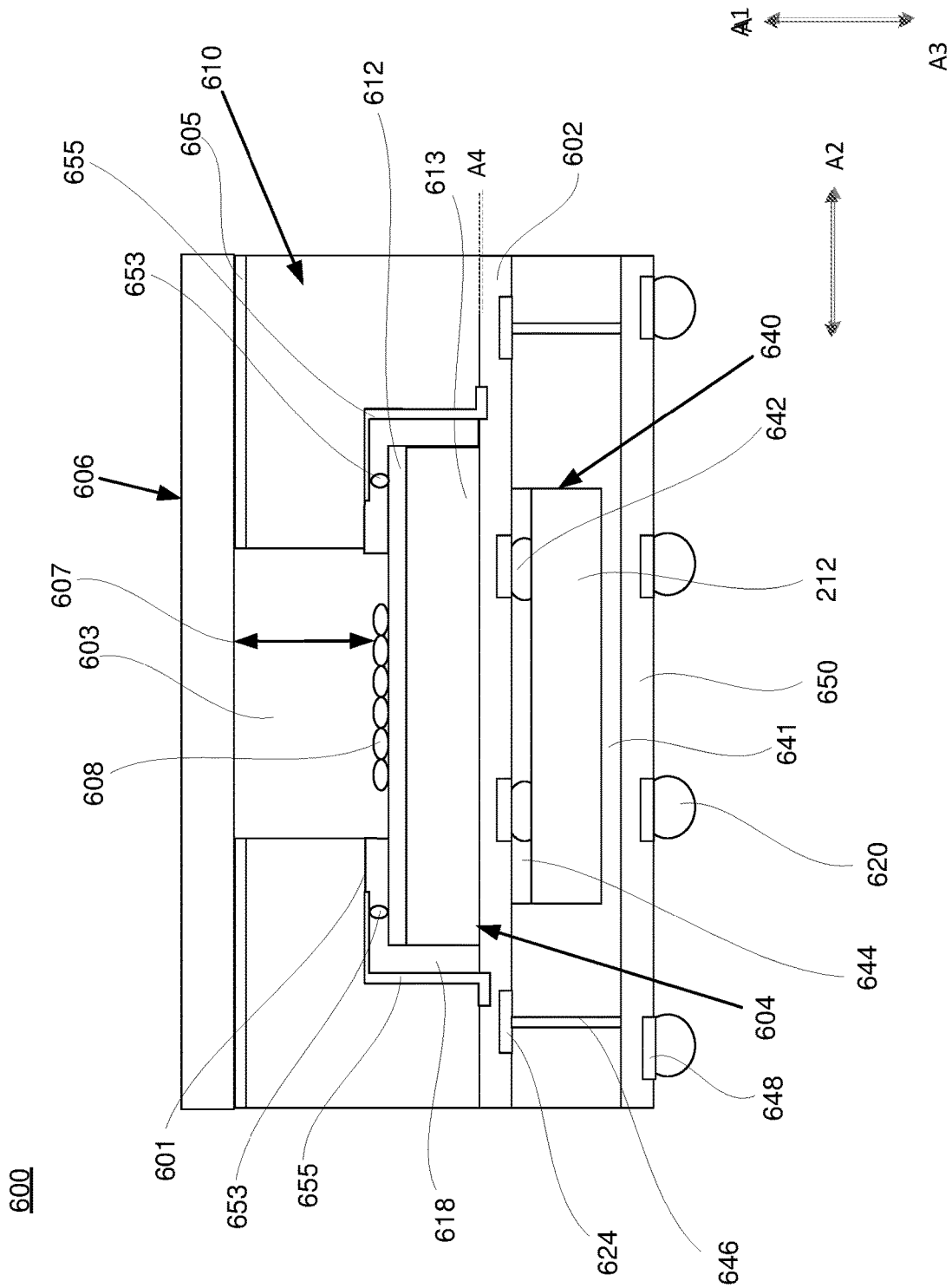

FIG. 6 illustrates an image sensor package 600 according to an aspect. The image sensor package 600 includes multiple semiconductor devices. In some examples, the image sensor package 600 includes a CMOS image sensor package with multiple semiconductor devices arranged in a two-level configuration. The image sensor package 600 may include an image sensor die 604 and a device 640 arranged in a stacked configuration. The image sensor package 600 may include a first level similar to FIG. 5 and a second level similar to FIG. 3. The image sensor package 600 may include any of the features described with reference to the previous figures.

The image sensor die 604 is coupled to the substrate 602. The image sensor die 604 may include an image sensor semiconductor die (e.g., a CMOS image sensor die). In some examples, the image sensor die 604 includes an interconnection layer 612 and a sensor substrate layer 613. In some examples, similar to the image sensor package 500 of FIG. 5, the image sensor die 604 does not include a redistribution layer on the backside of the image sensor die 604, and does not include a via through the sensor substrate layer 613. The image sensor die 604 includes a sensor array 608 having an array of pixel elements configured to convert electromagnetic radiation (e.g., light) to electrical signals.

In some examples, the substrate 602 is a redistribution layer (e.g., a package redistribution layer). The redistribution layer may include one or more electrical traces and/or one or more passivation layers. As shown in FIG. 6, the substrate 602 may include conductive contacts 624, and the conductive contacts 624 may include metallic elements such as conductive pads or terminals that are used to transfer electrical signals.

The interposer 610 defines a first cavity area 601 that holds the image sensor die 604, and a second cavity area 603 that defines (at least in part) an empty space between the image sensor die 604 and the transparent member 606. The image sensor die 604 is disposed within the first cavity area 601, and coupled to the interposer 610 using a bonding material 618. The bonding material 618 is configured to hold the image sensor die 604 within the first cavity area 601. The interposer 610 is also coupled to the substrate 602. In some examples, the interposer 610 includes a base material (e.g., a dielectric/insulating material) that may or may not have electrical traces.

Metal trace portions 655 are disposed on the interposer 610 within the first cavity area 601 and may extend to the substrate 602. A conductive bump 653 is disposed within the first cavity area 601 between a metal trace portion 655 and the interconnection layer 612 of the image sensor die 604. For example, the conductive bump 653 is coupled to the metal trace portion 655 and the interconnection layer 612.

A transparent member 606 is coupled to the interposer 610 using the bonding material 605. In some examples, the bonding material 605 includes an adhesive material, a glue bonding material, a fusion bonding material, an anodic bonding material, an epoxy resin, and/or a polymer-based material. The interposer 610 and the bonding material 605 may position the transparent member 606 away from the sensor array 608 in the direction A1. The distance between the transparent member 606 and the sensor array 608 defines a gap height 607, and the gap height 607 is controlled by the thickness of the interposer 610 and the thickness of the bonding material 605 in the direction A1. In some examples, the thickness of the interposer 610 is at least twice the thickness of the bonding material 605.

As shown in FIG. 6, the device 640 is coupled to the substrate 602. In some examples, the device 640 is coupled to the substrate 602 in a flip chip configuration. For example, the device 640 is coupled to the substrate 602 using one or more bump members 642 (e.g., copper pillars with solder, gold plated bumps, solder bumps, and/or gold stud bumps, etc.), and an under-fill material 644 is disposed in the gap between the device 640 and the substrate 602, where the under-fill material 644 encapsulates the bump members 642.

As shown in FIG. 6, the image sensor package 600 includes a substrate 650, and a molding 641 that extends between the substrate 650 and the substrate 602. The molding 641 may include an encapsulation material such as an epoxy molding. The molding 641 may encapsulate the device 640. In some examples, the substrate 650 is a redistribution layer. The redistribution layer may include one or more electrical traces and one or more passivation layers. The substrate 650 may include conductive contacts 648.

The image sensor package 600 includes one or more vias 646 that extend through the molding 641. For example, each via 646 may extend from a particular conductive contact 624 on the substrate 602 to the substrate 650. The image sensor package 600 includes conductive components 620 coupled to the conductive contacts 648 of the substrate 650. In some examples, the conductive components 620 are surface-mount packaging elements.

Figure 7:
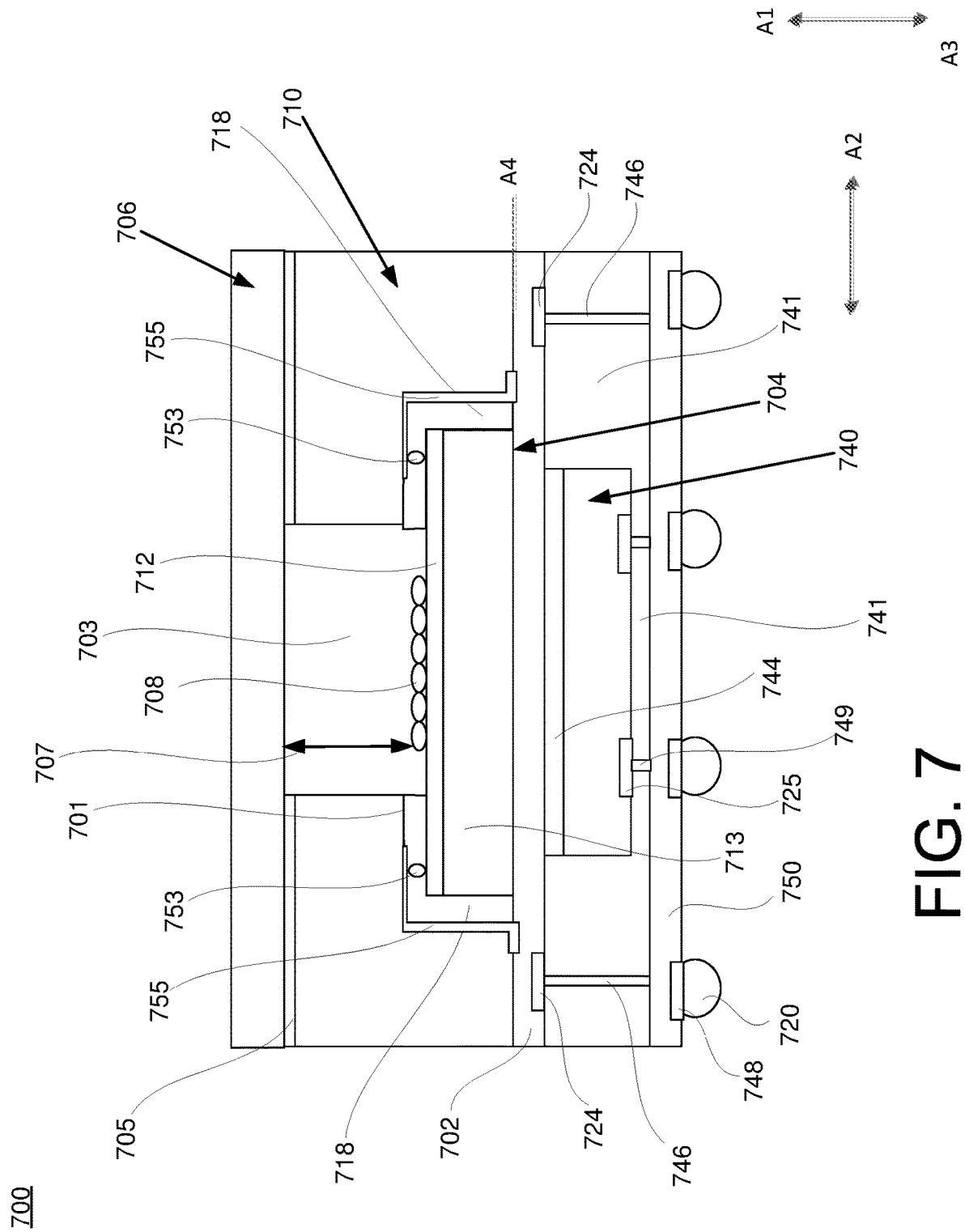

FIG. 7 illustrates an image sensor package 700 according to an aspect. The image sensor package 700 includes multiple semiconductor devices. In some examples, the image sensor package 700 includes a CMOS image sensor package with multiple semiconductor devices arranged in a two-level configuration. The image sensor package 700 may include an image sensor die 704 and a device 740 arranged in a stacked configuration. The image sensor package 700 may include a first level similar to FIGS. 5 and 6, and a second level similar to FIG. 4. The image sensor package 700 may include any of the features described with reference to the previous figures.

The image sensor die 704 is coupled to the substrate 702. The image sensor die 704 may include an image sensor semiconductor die (e.g., a CMOS image sensor die). In some examples, the image sensor die 704 includes an interconnection layer 712 and a sensor substrate layer 713. In some examples, the image sensor die 704 does not include a redistribution layer on the backside of the image sensor die 704, and does not include a via through the sensor substrate layer 713. The image sensor die 704 includes a sensor array 708 having an array of pixel elements configured to convert electromagnetic radiation (e.g., light) to electrical signals.

In some examples, the substrate 702 is a redistribution layer (e.g., a package redistribution layer). The redistribution layer may include one or more electrical traces and/or one or more passivation layers. As shown in FIG. 7, the substrate 702 may include conductive contacts 724, and the conductive contacts 724 may include metallic elements such as conductive pads or terminals that are used to transfer electrical signals.

The interposer 710 defines a first cavity area 701 that holds the image sensor die 704, and a second cavity area 703 that defines (at least in part) an empty space between the image sensor die 704 and the transparent member 706. The image sensor die 704 is disposed within the first cavity area 701, and coupled to the interposer 710 using a bonding material 718. The bonding material 718 is configured to hold the image sensor die 704 within the first cavity area 701. The interposer 710 is also coupled to the substrate 702. In some examples, the interposer 710 includes a base material (e.g., a dielectric/insulating material) that may or may not have electrical traces.

Metal trace portions 755 are disposed on the interposer 710 within the first cavity area 701 and may extend to the substrate 702. A conductive bump 753 is disposed within the first cavity area 701 between a metal trace portion 755 and the interconnection layer 712 of the image sensor die 704. For example, the conductive bump 753 is coupled to the metal trace portion 755 and the interconnection layer 712.

A transparent member 706 is coupled to the interposer 710 using the bonding material 705. In some examples, the bonding material 705 includes an adhesive material, a glue bonding material, a fusion bonding material, an anodic bonding material, an epoxy resin, and/or a polymer-based material. The interposer 710 and the bonding material 705 may position the transparent member 706 away from the sensor array 708 in the direction A1. The distance between the transparent member 706 and the sensor array 708 defines a gap height 707, and the gap height 707 is controlled by the thickness of the interposer 710 and the thickness of the bonding material 705 in the direction A1. In some examples, the thickness of the interposer 710 is at least twice the thickness of the bonding material 705.

As shown in FIG. 7 the device 740 is coupled to the substrate 702 using the bonding material 744. As shown in FIG. 7, the image sensor package 700 includes a substrate 750, and a molding 741 that extends between the substrate 750 and the substrate 702. The molding 741 may include an encapsulation material such as an epoxy molding. The molding 741 may encapsulate the device 740. In some examples, the substrate 750 is a redistribution layer. The redistribution layer may include one or more electrical traces and one or more passivation layers. The substrate 750 may include conductive contacts 748.

Referring to FIG. 7, the image sensor package 700 includes vias 749, where each via 749 extends from a conductive contact 725 on the device 740 to the substrate 750 (through the molding 741). In some examples, the image sensor package 700 includes one or more vias 746 that extend through the molding 741. For example, the vias 746 may extend from the substrate 702 to the substrate 750. The image sensor package 700 includes conductive components 720 coupled to the conductive contacts 748 of the substrate 750. In some examples, the conductive components 720 are surface-mount packaging elements.

FIG. 8 illustrates a process flow 800 for an image sensor die 804 according to an aspect. The image sensor die 804 may be the image sensor die 204, the image sensor die 304, and the image sensor die 404 of FIGS. 2 through 4, respectively. In operation 860, the image sensor die 804 is provided, where the image sensor die 804 includes an interconnection layer 812, a sensor substrate layer 813, a sensor array 808 coupled to the interconnection layer 812, and vias 816 connected to the interconnection layer 812 and extending into the sensor substrate layer 813. In operation 862, the sensor substrate layer 813 is thinned to reveal the vias 816, and a redistribution layer 814 is coupled to the sensor substrate layer 813 such that the vias 816 connect the interconnection layer 812 to the redistribution layer 814. In operation 864, the image sensor die 804 is flipped.

FIG. 9 illustrates a process flow 900 for an image sensor die 904 according to an aspect. The image sensor die 904 may be the image sensor die 504, the image sensor die 604, and the image sensor die 704 of FIGS. 5 through 7, respectively. In operation 960, the image sensor die 904 is provided, where the image sensor die 904 includes an interconnection layer 912, a sensor substrate layer 913, and a sensor array 908 coupled to the interconnection layer 912. In operation 962, the sensor substrate layer 913 is thinned, and, in operation 964, conductive bumps 953 are attached to the interconnection layer 912.

Figure 10:
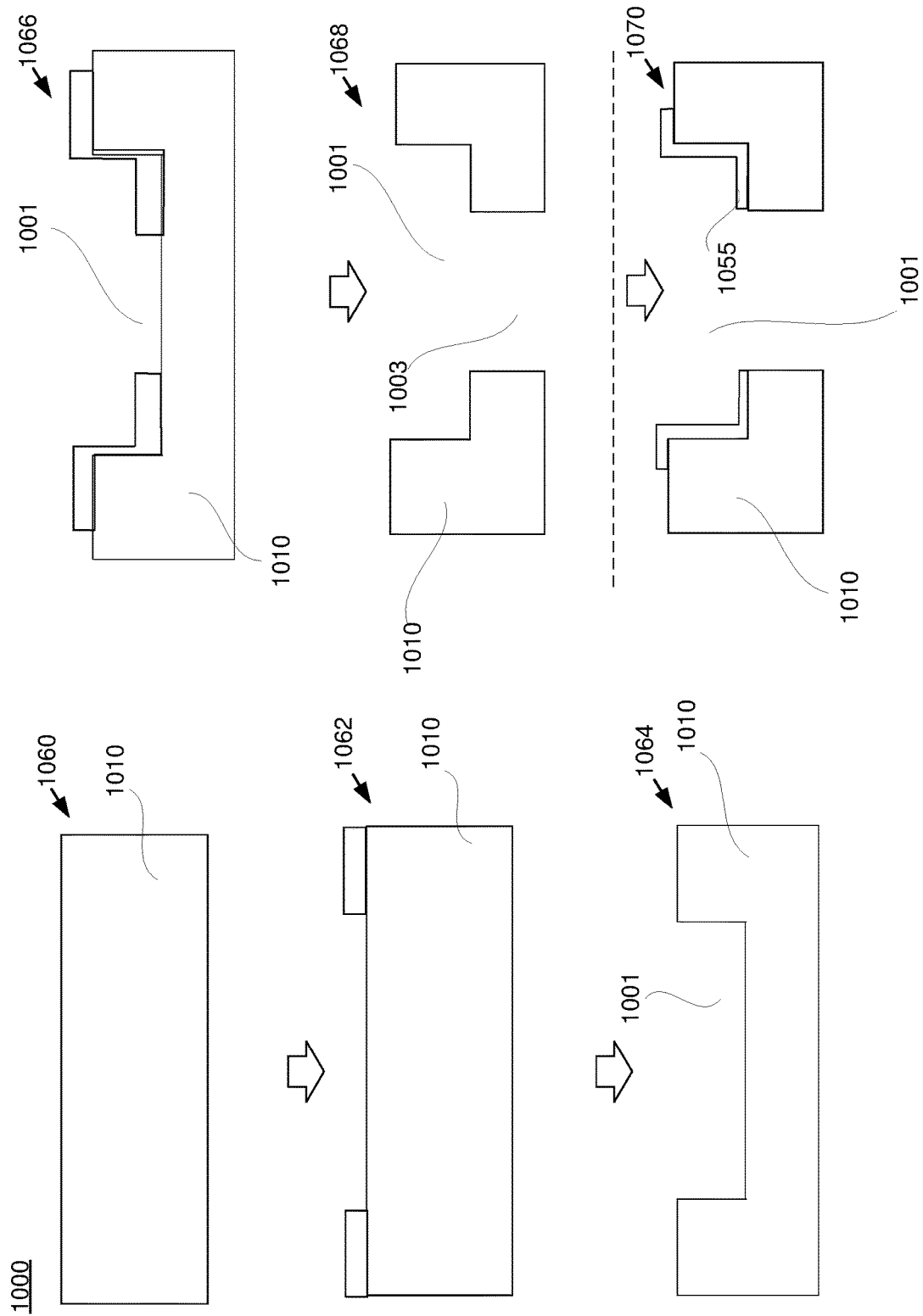

FIG. 10 illustrates a process flow 1000 for an interposer 1010. The interposer 1010 may be any of the previously described interposers. The process flow 1000 may be a micro-machining processing for the interposer 1010. In some examples, the interposer 1010 is a silicon interposer. In operation 1060, the interposer 1010 is provided. In operation 1062, a first photo lithography process is performed on the interposer 1010. In operation 1064, a first etching and PR stripping process is performed on the interposer 1010 to create a first cavity area 1001. In operation 1066, a second photo lithography process is performed on the interposer 1010. In operation 1068, a second etching and PR stripping process is performed on the interposer 1010 to create a second cavity area 1003. In some examples, in operation 1070, metal trace portions 1055 are coupled to portions of the interposer 1010 that define the first cavity area 1001.

Figure 11:
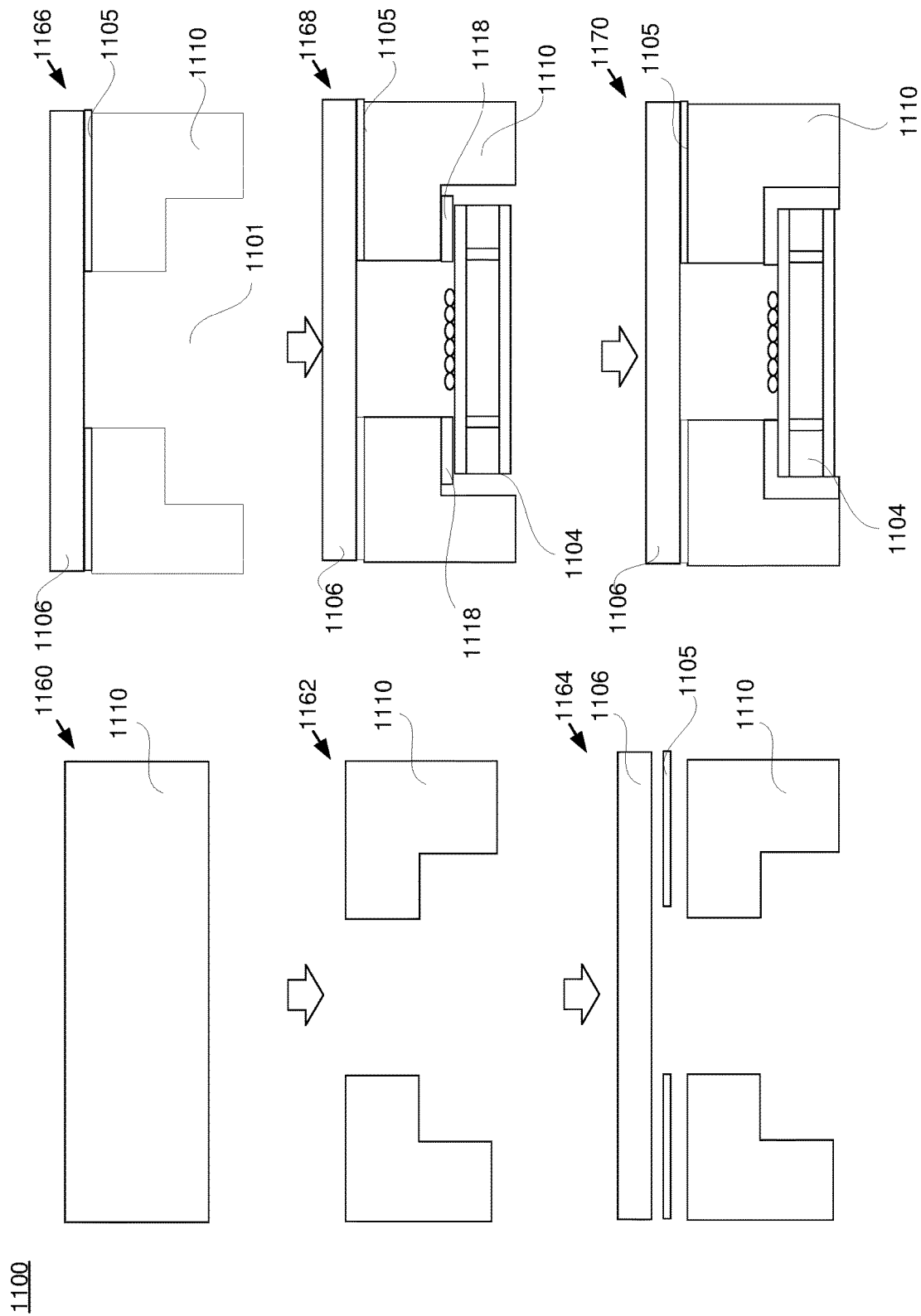

FIG. 11 illustrates a package process flow 1100 for an image sensor package according to an aspect. In operation 1160, an interposer 1110 is provided. In operation 1162, the micro-machining process is performed (e.g., process flow 1000 of FIG. 10). In operation 1164 and operation 1166, a transparent member 1106 is coupled to the interposer 1110 using a bonding material 1105. In operation 1168, an image sensor die 1104 is disposed within a first cavity area 1101 of the interposer 1110. In operation 1170, a bonding material 1118 is used in the gap between the interposer 1110 and the image sensor die 1104 to hold the image sensor die 1104 within the first cavity area 1101.

Figure 12:
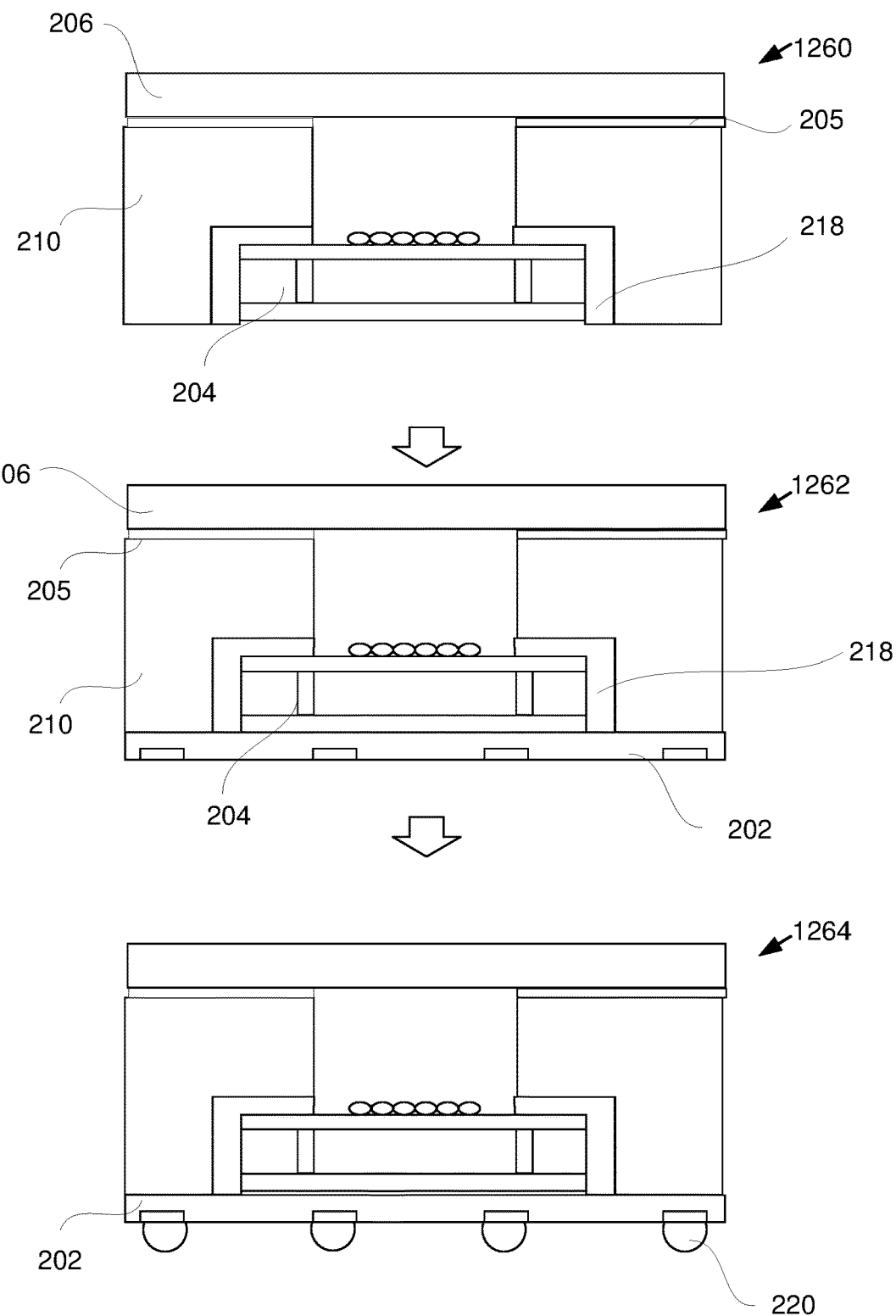

FIG. 12 illustrates a package process flow 1200 for the image sensor package 200 of FIG. 2 (or other image sensor packages described herein). In some examples, the package process flow 1200 is a continuation of the process of FIG. 11. In operation 1260, a part of the image sensor package 200 is provided. For example, the image sensor package 200 includes the interposer 210 coupled to the transparent member 206 using the bonding material 205, and the image sensor die 204 is coupled to the interposer 210 using the bonding material 218. In operation 1262, a passivation and redistribution layer process is performed to form and couple the substrate 202 to the interposer 210 and the image sensor die 204. In operation 1264, the conductive components 220 are coupled to the substrate 202.

Figure 13:
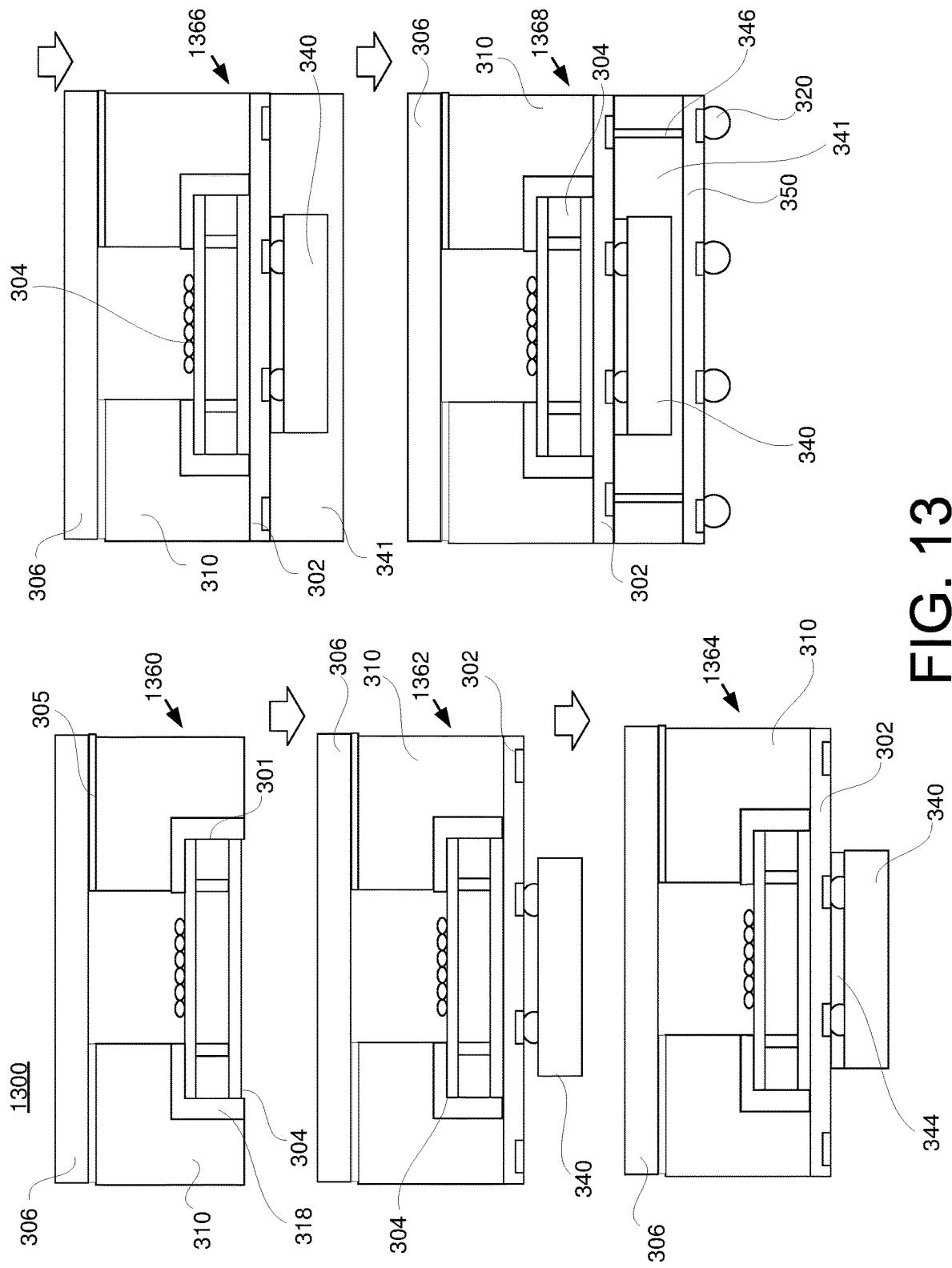

FIG. 13 illustrates a package process flow 1300 for the image sensor package 300 of FIG. 3 (or other image sensor packages described herein) according to an aspect. In operation 1360, a part of the image sensor package 300 is provided, where the part includes the interposer 310 coupled to the transparent member 306 via the bonding material 305, and the image sensor die 304 is disposed within the first cavity area 301 of the interposer 310 and coupled to the interposer 310 via the bonding material 318. In operation 1362, the substrate 302 is formed and coupled to the interposer 310 and the image sensor die 304, and the device 340 is flip-chip bonded to the substrate 302. In operation 1364, the under-fill material 344 is disposed between the substrate 302 and the device 340. In operation 1366, a molding process is performed to provide the molding 341 onto the substrate 302 such that the molding 341 encapsulates the device 340. In operation 1368, the vias 346 are formed through the molding 341, the substrate 350 is coupled to the molding 341, and the conductive components 320 are coupled to the substrate 350.

Figure 14:
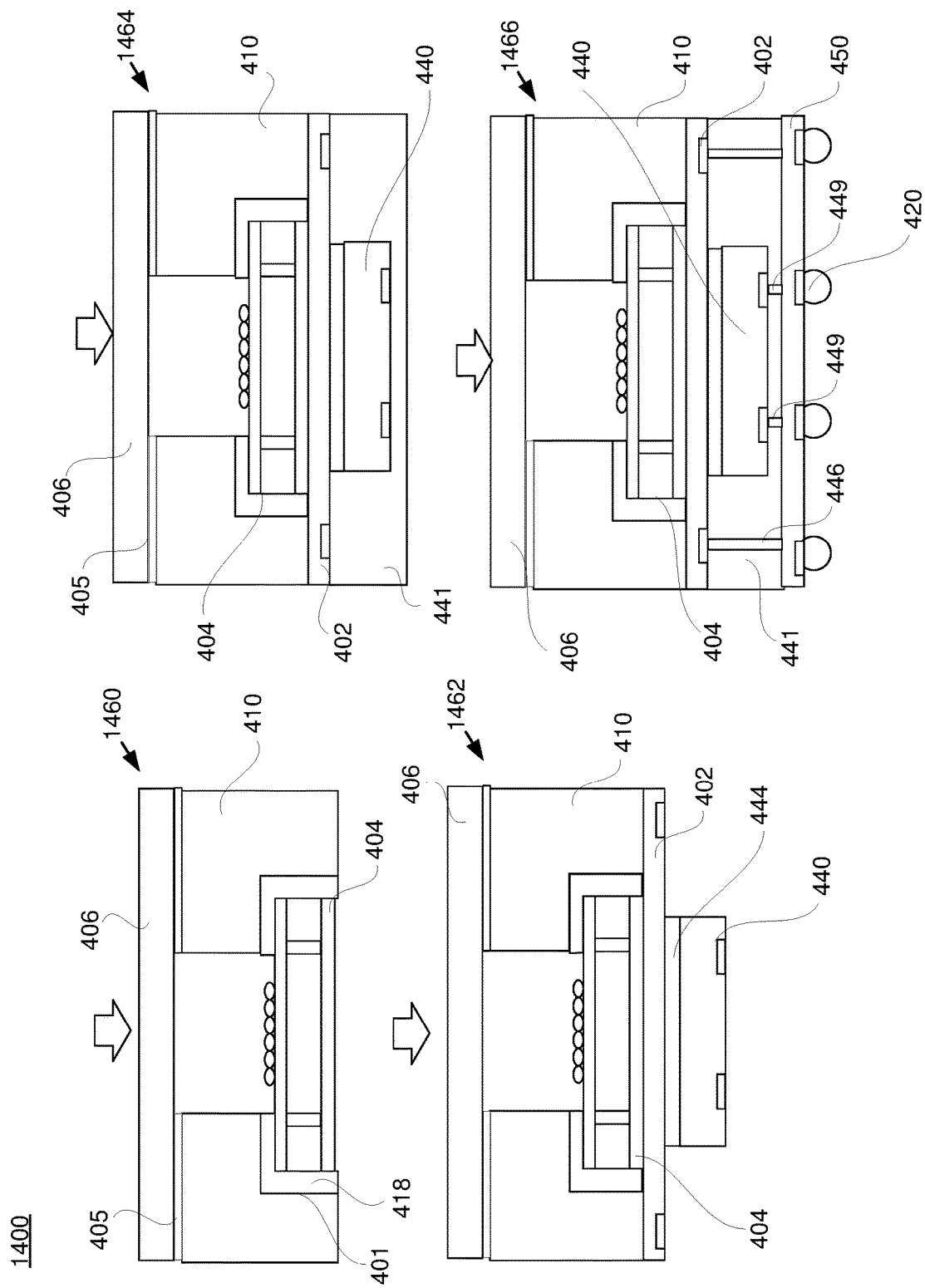

FIG. 14 illustrates a package process flow 1400 for the image sensor package 400 (or other image sensor packages discussed herein) according to an aspect. In operation 1460, a part of the image sensor package 400 is provided, where the part includes the interposer 410 that is coupled to the transparent member 406 via the bonding material 405, and the image sensor die 404 is disposed within the first cavity area 401 and coupled to the interposer 410 using the bonding material 418. In operation 1462, the substrate 402 is coupled to the image sensor die 404 and the substrate 402, and the device 440 is die bonded to the substrate 402 using a bonding material 444. In operation 1464, a molding process is performed to form the molding 441. In operation 1466, the substrate 450 is formed and coupled to the molding 441, and the conductive components 420 are formed on the substrate 450. Also, the vias 446 are formed through the molding 441 to connect the substrate 402 to the substrate 450, and the vias 449 are formed through the molding 441 to connect the device 440 to the substrate 450.

Figure 15A:
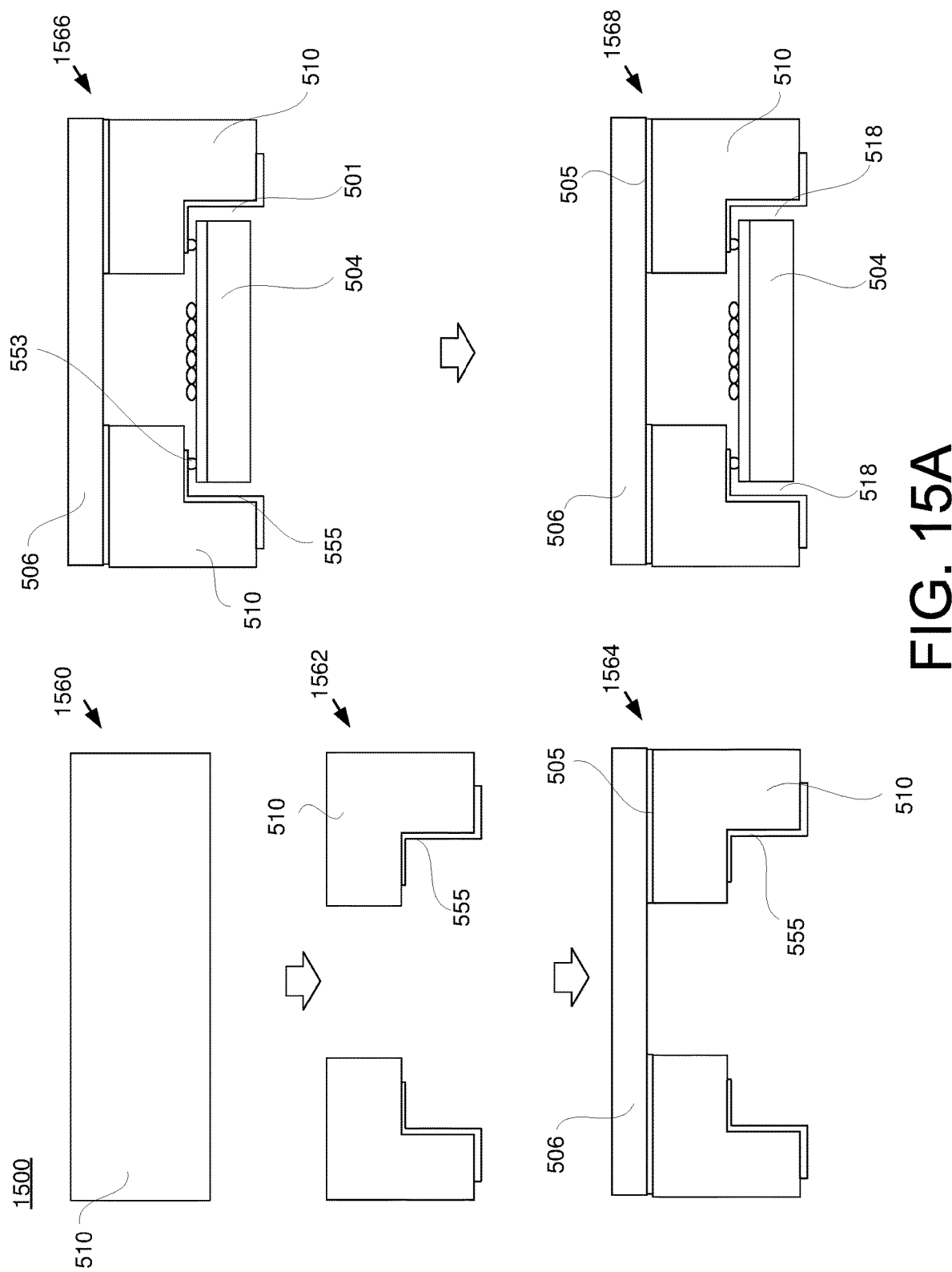
FIG. 15A illustrate example operations for fabricating an image sensor package according to an aspect.
Figure 15B:
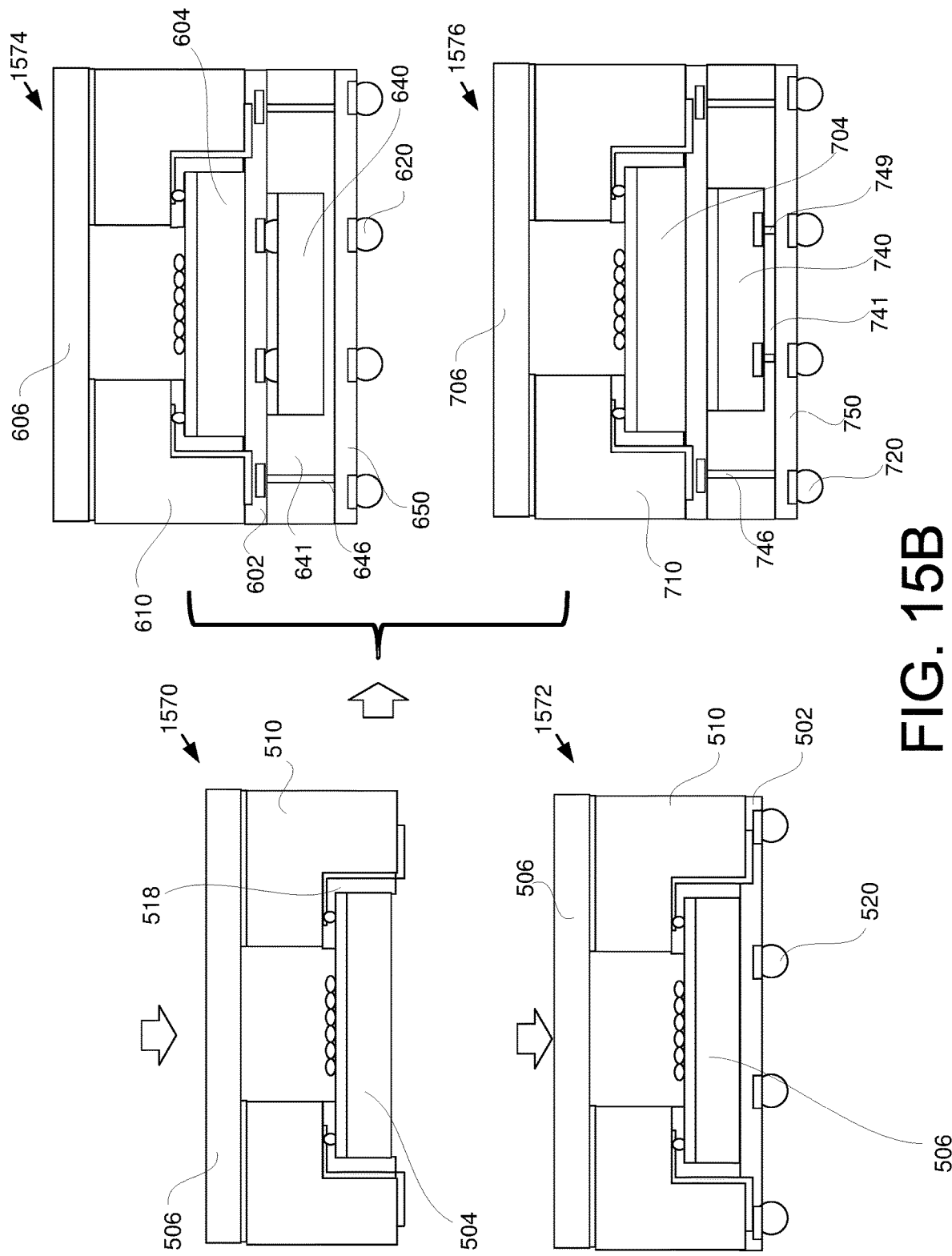
FIG. 15B illustrate continuing example operations for the image sensor package of FIG. 15A according to an aspect.

FIGS. 15A and 15B illustrate a flow process 1500 for the image sensor package 500, the image sensor package 600, and/or the image sensor package 700 (or other image sensor packages discussed herein) according to an aspect.

Referring to FIG. 15A, in operation 1560, the interposer 510 is provided. In operation 1562, the micro-machining process is performed (e.g., process flow 1000 of FIG. 10) on the interposer 510. In operation 1564, the transparent member 506 is coupled to the interposer 510 using the bonding material 505. In operation 1566, the image sensor die 504 is disposed within the first cavity area 501 of the interposer 510 and coupled to the metal trace portion 555 via the conductive bump 553. In operation 1568, the bonding material 518 is deposited in the gap between the interposer 510 and the image sensor die 504.

Referring to FIG. 15B, in operation 1570, a part of the image sensor die 504 is provided, where the image sensor die 504 is flip-chip bonded to the interposer 510, and the bonding material 518 is disposed between the gap. In operation 1572, the substrate 502 is formed and coupled to the interposer 510 and the image sensor die 504, and the conductive components 520 are coupled to the substrate 502.

In some examples, instead of performing operation 1572, the process flow 1500 goes from operation 1570 to operation 1574 to develop the image sensor package 600. In operation 1574, the second level is added to the package. For instance, the substrate 602 is formed and coupled to the image sensor die 604 and the interposer 610 (the interposer 610 being coupled to the transparent member 606). The device 640 is flip-chip bonded to the substrate 602, the molding 641 is formed on the substrate 602 to encapsulate the device 640, and the vias 646 are formed through the molding 641 to connect the substrate 602 to the substrate 650.

In some examples, instead of performing operation 1572 (and operation 1574), the process flow goes from operation 1570 to operation 1576 to develop the image sensor package 700 of FIG. 7. In operation 1574, the second level is added to the package. For instance, the substrate 702 is formed and coupled to the image sensor die 704 and the interposer 710 (the interposer 710 being coupled to the transparent member 706). The device 740 is die bonded to the substrate 702, the molding 741 is formed on the substrate 702 to encapsulate the device 740, and the vias 746 are formed through the molding 741 to connect the substrate 702 to the substrate 750. Also, the vias 749 are formed through the molding 741 to connect the device 740 to the substrate 750.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A method for assembling an image sensor package;
  forming an interposer with a cavity area;
  coupling a light transmitting member to the interposer using a first bonding material, the interposer includes a portion having a first inner edge and a second inner edge, the second inner edge being aligned non-parallel to the first inner edge, the portion including an outer edge that is aligned with an outer edge of the light transmitting member;
  removing a portion of an image sensor die to expose a conductive via;
  coupling a redistribution layer to the conductive via;
  disposing the image sensor die within the cavity area; and
  applying a second bonding material to a gap between an edge of the image sensor die and a portion of the interposer defined by the cavity area, a height of the interposer at least partially defining a distance between the light transmitting member and a sensory array of the image sensor die.

2. The method of claim 1, further comprising:
  applying a metal trace portion to the portion of the interposer defined by the cavity area.

3. The method of claim 1, wherein the cavity area includes a first cavity area portion and a second cavity area portion, wherein forming the interposer includes removing a first portion of the interposer to form the first cavity area portion and removing a second portion of the interposer to form the second cavity area portion.

4. The method of claim 1, wherein the image sensor die includes an interconnection layer and[H] a sensor substrate layer,
  wherein removing the portion of the image sensor die includes removing a portion of the sensor substrate layer to expose the conductive via; and
  wherein coupling the redistribution layer to the conductive via includes coupling the redistribution layer to the sensor substrate layer such that the conductive via connects the interconnection layer to the redistribution layer.

5. The method of claim 4, further comprising:
  coupling one or more conductive bumps to the interconnection layer.

6. The method of claim 1, further comprising:
  coupling a substrate to the image sensor die and the interposer.

7. The method of claim 6, further comprising:
  coupling a semiconductor device to the substrate.

8. The method of claim 7, wherein the semiconductor device is coupled to the substrate in a flip-chip configuration.

9. The method of claim 7, wherein the semiconductor device is coupled to the substrate using a third bonding material.

10. A method for assembling an image sensor package, the method comprising:
  forming an interposer with a cavity area;
  coupling a light transmitting member to the interposer using a first bonding material;
  disposing an image sensor die within the cavity area;
  applying a second bonding material to a gap between an edge of the image sensor die and a portion of the interposer defined by the cavity area;
  coupling a first substrate to the image sensor die and the interposer;
  coupling a semiconductor device to the first substrate;
  disposing an underfill material between the first substrate and the semiconductor device;
  applying a molding to the first substrate and the semiconductor device such that the molding encapsulates the semiconductor device;
  coupling a second substrate to the molding; and
  forming one or more conductive vias through the molding between the first substrate and the second substrate.

11. A method for assembling an image sensor package, the method comprising:
  forming an interposer with a cavity area;
  coupling a light transmitting member to the interposer using a first bonding material;
  disposing an image sensor die within the cavity area;
  applying a second bonding material to a gap between an edge of the image sensor die and a portion of the interposer defined by the cavity area;
  coupling a first substrate to the image sensor die and the interposer;
  coupling a semiconductor device to the first substrate;
  applying a molding to the first substrate and the semiconductor device such that the molding encapsulates the semiconductor device;
  coupling a second substrate to the molding;
  forming one or more first conductive vias through the molding to connect the first substrate to the second substrate; and
  forming one or more second conductive vias through the molding to connect the image sensor die to the second substrate.

12. A method for assembling an image sensor package;
  forming an interposer with a cavity area, the interposer including a portion having a first inner edge and a second inner edge, the second inner edge being aligned non- parallel to the first inner edge;
  applying a first bonding material to the interposer;
  placing a light transmitting member on the first bonding material to couple the light transmitting member to the interposer;
  disposing an image sensor die within the cavity area;
  applying a second bonding material to a gap between an edge of the image sensor die and a portion of the interposer defined by the cavity area, a height of the interposer at least partially defining a distance between the light transmitting member and a sensory array of the image sensor die; and
  coupling a first substrate to the image sensor die and the interposer, the portion of the interposer including an outer edge that is aligned with an outer edge of the first substrate;
  coupling a semiconductor device to the first substrate;
  applying a molding to the first substrate and the semiconductor device such that the molding encapsulates the semiconductor device;
  coupling a second substrate to the molding; and
  forming a conductive via through the molding between the first substrate and the second substrate.

13. The method of claim 12, further comprising:
applying a metal trace portion to the interposer.

14. The method of claim 12, wherein the image sensor die includes an interconnection layer and a sensor substrate layer, the method further comprising:
removing a portion of the sensor substrate layer to expose the conductive via; and
coupling a redistribution layer to the sensor substrate layer such that the conductive via connects the interconnection layer to the redistribution layer.

15. The method of claim 12, wherein the conductive via is a first conductive via, the method further comprising:
forming a second conductive via through the molding to connect the image sensor die to the second substrate, the second conductive via having a length that is less than a length of the first conductive via.

16. A method for assembling an image sensor package, the method comprising:
removing a first portion of an interposer via a first etching and stripping process to form a first cavity area portion;
removing a second portion of the interposer via a second etching and stripping process to form a second cavity area portion;
applying a first bonding material to the interposer;
placing a light transmitting member on the first bonding material to couple the light transmitting member to the interposer;
disposing an image sensor die within the second cavity area portion;
applying a second bonding material to a gap between an edge of the image sensor die and a portion of the interposer defined by the second cavity area portion; and
coupling a substrate to the image sensor die and the interposer.

* * * * *